US012763665B2

(12) United States Patent
Zeng

(10) Patent No.: US 12,763,665 B2
(45) Date of Patent: Oct. 13, 2026

(54) POWER CONVERSION DEVICE

(71) Applicant: MetaPWR Electronics Co., Ltd., Shanghai (CN)

(72) Inventor: Jianhong Zeng, Shanghai (CN)

(73) Assignee: MetaPWR Electronics Co., Ltd., Shanghai (CN)

( * ) Notice: Subject to any disclaimer, the term of this patent is extended or adjusted under 35 U.S.C. 154(b) by 146 days.

(21) Appl. No.: 18/798,857

(22) Filed: Aug. 9, 2024

(65) Prior Publication Data

US 2025/0062677 A1 Feb. 20, 2025

(30) Foreign Application Priority Data

Aug. 15, 2023 (CN) ........................ 202311026795.9

(51) Int. Cl.

*H05K 7/20* (2006.01)
*H02M 1/00* (2006.01)
*H02M 3/158* (2006.01)

(52) U.S. Cl.

CPC ....... *H02M 1/0095* (2021.05); *H02M 3/1586* (2021.05); *H05K 7/209* (2013.01)

(58) Field of Classification Search

CPC ............ H02M 1/0095; H02M 1/0067; H02M 1/0083; H02M 3/1586; H02M 3/156; H02M 3/1563; H02M 3/157; H02M 3/158; H02M 3/1582; H05K 7/209; H05K 7/20918

See application file for complete search history.

(56) References Cited

U.S. PATENT DOCUMENTS 10,128,764 B1 * 11/2018 Vinciarelli ................ H01F 3/10
12,369,252 B2 * 7/2025 Miki ...................... H05K 3/368
2017/0303427 A1 * 10/2017 Tsao ...................... H05K 1/181

* cited by examiner

*Primary Examiner* — Nguyen Tran
(74) *Attorney, Agent, or Firm* — JCIPRNET

(57) ABSTRACT

A power conversion device is provided. The power conversion device is applied to a circuit topology and layout of the six-switch flying capacitor voltage reduction type conversion circuit which is applied to the intermediate bus converter. The layout of the transformer and the inductor is provided, so that the parasitic resistance of the winding in the magnetic core assembly is minimum. An auxiliary switch and an auxiliary winding are additionally arranged on the six-switch flying capacitor voltage reduction type conversion circuit, and the auxiliary switch and the auxiliary winding are used for providing enough energy for the output end when the input voltage is lower than four times of the output voltage. A switch layout is provided to reduce parasitic parameters and power losses of a transformer winding AC loop, and parasitic parameters and power losses on the switch bridge arm path.

18 Claims, 11 Drawing Sheets

POWER CONVERSION DEVICE

CROSS-REFERENCE TO RELATED APPLICATION

This application claims the priority benefit of China application no. 202311026795.9, filed on Aug. 15, 2023. The entirety of the above-mentioned patent application is hereby incorporated by reference herein and made a part of this specification.

BACKGROUND

With the development of artificial intelligence, the power requirements of an intelligent data processing chip, such as a GPU/CPU NPU and the like (collectively referred to as XPU) are higher and higher, so that the power of the server is greatly increased, the input voltage of the server gradually changes from 12V to 48V, and the working voltage of the XPU becomes lower and lower along with the progress of the process and gradually moves from 0.8V to 0.65V. Therefore, the gain ratio of the output voltage to the input voltage is lower and lower, so that the two-stage voltage-reduction circuit architecture gradually becomes mainstream; and in order to obtain high conversion efficiency of 48V input to 0.65V output conversion efficiency, the intermediate bus voltage moves from 12V to 6.75V or even 3.3V.

Aiming at the solution of a 48V input and 12V-3.3V voltage-stabilized output power conversion device, the auxiliary winding and the auxiliary switch are added, and enough energy is provided for the output end when the input voltage Vin is lower than four times of the output voltage Vo; and by improving the layout of the transformer, the inductor and other power devices, the parasitic parameters of the power conversion device are further reduced.

SUMMARY

In view of the above, one of the objectives of the present application is to provide a power conversion device, wherein when an input voltage Vin is 4 times lower than an output voltage Vo, sufficient energy is provided for an output end by adding an auxiliary winding and an auxiliary switch; and parasitic parameters on a power transmission path are reduced by optimizing the layout of key devices such as a transformer and an inductor, and the conversion efficiency of the power conversion device is improved.

The power conversion device comprises a circuit substrate, an upper switch, a middle switch, a lower switch, a first flying capacitor, an input capacitor, an output capacitor and a transformer;

- the circuit substrate comprises a first surface and a second surface opposite to each other, two transformer side column holes, a transformer middle column hole, a lower switch area, a first flying capacitor area, a first upper middle switch area and an output area;
- the lower switch area, the first flying capacitor area, the first upper middle switch area and the output area are arranged on the first surface of the circuit substrate;
- the two transformer side column holes and the transformer middle column hole penetrate through the first surface and the second surface, and respectively used for side columns of the transformer and a middle column of the transformer to penetrate through; a transformer winding area is arranged between each of the two transformer side column holes and the transformer middle column hole, a winding of the transformer penetrates through the transformer winding area, and the transformer winding area comprises a first side and a second side opposite to each other;
- the lower switch area is arranged adjacent to the first side of the transformer winding area, the output area is arranged adjacent to the second side of the transformer winding area, the lower switch is arranged in the lower switch area, and the output capacitor is arranged in the output area;
- the first flying capacitor is arranged in the first flying capacitor area, and the lower switch area is arranged between the first flying capacitor area and the transformer winding area;
- the upper switch and the middle switch are arranged in the first upper middle switch area, and the first upper middle switch area is arranged adjacent to the first flying capacitor area and the lower switch area.

Preferably, wherein the first surface further comprises an input area, the input capacitor is arranged in the input area, and the first flying capacitor area is arranged between the input area and the lower switch area.

Preferably, the first surface further comprises a second upper middle switch area, the power conversion device further comprises a second upper switch and a second middle switch, and the second upper switch and the second middle switch are arranged in the second upper middle switch area.

Preferably, the first surface further comprises a second flying capacitor area, a third flying capacitor area and a fourth flying capacitor area; the power conversion device further comprises a second flying capacitor, a third flying capacitor and a fourth flying capacitor, and the second flying capacitor, the third flying capacitor and the fourth flying capacitor are sequentially arranged in the second flying capacitor area, the third flying capacitor area and the fourth flying capacitor area; the second flying capacitor area is arranged between the lower switch area and the input area, and the third flying capacitor area and the fourth flying capacitor area are respectively arranged on outer sides of the first upper middle switch area and the second upper middle switch area.

Preferably, the second surface comprises a fifth flying capacitor area, a lower switch area, an input area and an output area; the power conversion device further comprises a fifth flying capacitor, and an another lower switch, an input positive terminal, an output positive terminal and an output negative terminal; the input positive terminal is arranged in the input area on the second surface, the output positive terminal and the output negative terminal are arranged in the output area, the another lower switch is arranged in the lower switch area on the second surface, and the fifth flying capacitor is arranged in the fifth flying capacitor area; the lower switch area on the second surface is arranged close to one side of the transformer winding area, and the output area is arranged close to the other side of the transformer winding area; and the fifth flying capacitor area is arranged between the input area on the second surface and the lower switch area on the second surface.

Preferably, a projection on the first surface of the lower switch area arranged on the second surface and a projection of the lower switch area arranged on are at least partially overlapped; a projection on the first surface of the input area arranged on the second surface and a projection of the first surface are at least partially overlapped with the input area arranged on the first surface; and a projection on the first surface of the output area arranged on the second surface and the first surface arranged on the first surface are at least partially overlapped.

Preferably, the power conversion device further comprises a heat dissipation block and a grounding metal block, wherein the heat dissipation block is welded to the first surface; and the grounding metal block is welded to the second surface and is electrically connected to an output negative terminal of the power conversion device.

A power conversion device comprises an input positive terminal, an input negative terminal, an output positive terminal and an output negative terminal, wherein the input negative terminal is electrically connected with the output negative terminal;

the power conversion device further comprises a first bridge arm, a second bridge arm, two flying capacitors, an output capacitor, two transformer windings, an output inductor, an auxiliary switch and an auxiliary winding; the first bridge arm and the second bridge arm are electrically connected between the input positive terminal and the input negative terminal in parallel, the first bridge arm and the second bridge arm both comprise an upper switch, a middle switch and a lower switch, the upper switch and the middle switch in each of the first bridge arm and the second bridge arm are electrically connected to an upper node, and the middle switch and the lower switch in each of the first bridge arm and the second bridge arm are electrically connected to a lower node; one end of each of the two flying capacitors is electrically connected with one of the upper nodes, and the other end of each of the two flying capacitors is electrically connected with one of the lower nodes; a second end of the two transformer windings is electrically connected with one end of the output inductor, a first end of the two transformer windings is electrically connected with the other one of the lower nodes, and the other end of the output inductor is electrically connected with the output positive terminal; the output capacitor is bridged between the output positive terminal and the output negative terminal;

one end of the auxiliary winding is electrically connected with the input positive terminal, the other end of the auxiliary winding is electrically connected with a drain electrode of the auxiliary switch, and a source electrode of the auxiliary switch is electrically connected with the output positive terminal.

Preferably, the power conversion device further comprises a first control signal, a second control signal, a third control signal, a fourth control signal and a fifth control signal, and the switching periods of the first control signal, the second control signal, the third control signal, the fourth control signal and the fifth control signal are the same; the first control signal is used for controlling the upper switch of the first bridge arm and middle switch of the second bridge arm to be turned on and turned off, and the second control signal is used for controlling the middle switch of the first bridge arm and the upper switch of the second bridge arm to be turned on and turned off; the third control signal is used for controlling the lower switch of the first bridge arm to be turned on and turned off, and the fourth control signal is used for controlling the lower switch of the second bridge arm to be turned on and turned off; and the fifth control signal is used for controlling the auxiliary switch to be turned on and turned off.

Preferably, when an input end voltage of the power conversion device is less than four times of an output end voltage, a duty ratio of the first control signal and a duty ratio of the second control signal are equal and both are less than or equal to 0.5, and the first control signal and the second control signal are staggered by 180 degrees; the third control signal is the same as the second control signal, and the fourth control signal is the same as the first control signal; and each one of the switching periods comprises two half periods, in one half period of the two half periods, the fifth control signal is complementary to the first control signal, and in the other half period of the two half periods of the same switching period, the fifth control signal and the second control signal are complementary.

Preferably, when an input end voltage of the power conversion device is greater than or equal to four times of an output end voltage of the power conversion device, the duty ratio of the first control signal and the duty ratio of the second control signal are equal and are both less than or equal to 0.5, and the first control signal and the second control signal are staggered by 180 degrees; the third control signal is complementary to the first control signal, and the fourth control signal is complementary to the second control signal; and the fifth control signal is at a low level, and the auxiliary switch is in an “off” state.

A power conversion device comprises an input positive terminal, an input negative terminal, an output positive terminal and an output negative terminal, wherein the input negative terminal is electrically connected with the output negative terminal;

the power conversion device further comprises a first bridge arm and a second bridge arm; the first bridge arm and the second bridge arm are electrically connected between the input positive terminal and the input negative terminal in parallel, the first bridge arm and the second bridge arm both comprise an upper switch, a middle switch and a lower switch, the upper switch and the middle switch in each of the first bridge arm and the second bridge arm are electrically connected to the upper node, and the middle switch and the lower switch in each of the first bridge arm and the second bridge arm are electrically connected to the lower node;

the power conversion device further comprises a first driving unit, a second driving unit, a third driving unit and four control signals; and each of the first driving unit, the second driving unit, and the third driving unit receives two corresponding control signals in the four control signals; the first driving unit is used for driving the upper switch of the first bridge arm and the upper switch of the second bridge arm to be turned on and turned off, the second driving unit is used for driving the middle switch and the lower switch of the first bridge arm to be turned on and turned off, and the third driving unit is used for driving the middle switch and the lower switch of the second bridge arm to be turned on and turned off.

Preferably, wherein the four control signals are respectively a first control signal, a second control signal, a third control signal and a fourth control signal; the first control signal is used for controlling the upper switch of the first bridge arm and the middle switch of the second bridge arm to be turned on and turned off, and the second control signal is used for controlling the middle switch of the first bridge arm and the upper switch of the second bridge arm to be turned on and turned off; and the third control signal is used for controlling the lower switch of the first bridge arm to be turned on and turned off, and the fourth control signal is used for controlling the lower switch of the second bridge arm to be turned on and turned off.

Preferably, the second driving unit and the third driving unit are half-bridge driving units.

Preferably, the first driving unit receives a first control signal and a second control signal, a duty ratio of the first control signal and a duty ratio of the second control signal are the same, and a phase-shift between the first control signal and the second control signal is 180 degrees.

Preferably, each of the second driving unit and the third driving unit comprises a power supply pin, a pin HB, a pin HS, a pin HO, a pin LO, a driving diode and a driving capacitor; and a positive electrode of each of the driving diodes in the second driving unit and the third driving unit is electrically connected with the power supply pin of the first driving unit or the power supply pin of the second driving unit respectively; a negative electrode of each of the driving diodes in the second driving unit and the third driving unit is electrically connected with the pin HB of the first driving unit or the second driving unit respectively; each of the driving capacitors in the second driving unit and the third driving unit is bridged between the pin HB and the pin HS; the pin HS is electrically connected with the corresponding lower node; the pin HO is electrically connected with a gate electrode of a corresponding one of the middle switches in the first bridge arm and the second bridge arm, and the pin LO is electrically connected with a gate electrode of a corresponding one of the lower switches in the first bridge arm and the second bridge arm.

Preferably, the first driving unit comprises a pin HB1, a pin HS1, a pin HO1, a pin HB2, a pin HS2, a pin HO 2, a first driving diode, a second driving diode, a first driving capacitor and a second driving capacitor; a positive electrode of the first driving diode is electrically connected with the pin HB of the second driving unit, and a negative electrode of the first driving diode is electrically connected with the pin HB1; the positive electrode of the second driving diode is electrically connected with the pin HB of the third driving unit, and the negative electrode of the second driving diode is electrically connected with the pin HB2; the first driving capacitor is bridged between the pin HB1 and the pin HS1; the second driving capacitor is bridged between the pin HB2 and the pin HS2; the pin HO1 is used for driving the upper switch of the first bridge arm to be turned on and turned off; and the pin HO2 is used for driving the upper switch of the second bridge arm to be turned on and turned off.

A power conversion device comprises an input positive terminal, an input negative terminal, an output positive terminal and an output negative terminal, wherein the input negative terminal is electrically connected with the output negative terminal;

the power conversion device further comprises a first bridge arm, a second bridge arm, two flying capacitors, an output capacitor, two transformer windings, an output inductor, two input inductors, two input capacitors and two auxiliary switches; the first bridge arm and the second bridge arm are electrically connected between the input positive terminal and the input negative terminal in parallel, the first bridge arm and the second bridge arm both comprise an upper switch, a middle switch and a lower switch, the upper switch and the middle switch in each of the first bridge arm and the second bridge arm are electrically connected to the upper node, and the middle switch and the lower switch in each of the first bridge arm and the second bridge arm are electrically connected to one of the lower nodes; one end of each of the two flying capacitors is electrically connected with one of the upper nodes, and the other end of each of the two flying capacitors is electrically connected with the other one of the lower nodes; the second end of the two transformer windings is electrically connected with one end of an output inductor, the first end of the two transformer windings is electrically connected with one of the lower nodes, and the other end of the output inductor is electrically connected with the output positive terminal; the output capacitor is bridged between the output positive terminal and the output negative terminal; each of the two input capacitors is bridged at two ends of the first bridge arm and at two ends of the second bridge arm; one end of each of the two input inductors is electrically connected with the input positive terminal, and the other end of each of the two input inductors is electrically connected with the upper end of the first bridge arm and with an upper end of the second bridge arm;

the two auxiliary switches are connected in series between the upper end of the first bridge arm and the upper end of the second bridge arm; and source electrodes of the two auxiliary switches are short-circuited or drain electrodes of the two auxiliary switches are short-circuited.

Preferably, the power conversion device further comprises a first control signal, a second control signal, a third control signal and a fourth control signal, wherein the first control signal is used for controlling a switch of the first bridge arm to be turned on and turned off, and the second control signal is used for controlling the switch of the second bridge arm to be turned on and turned off; and a duty ratio of the first control signal and a duty ratio of the second control signal are the same, and a phase-shift between the first control signal and the second control signal is 180 degrees.

Preferably, when the duty ratio of the first control signal or the second control signal is less than or equal to 0.5, the two auxiliary switches are in a "Normally-On" state; the first control signal is further used for controlling the middle switch of the second bridge arm to be turned on and turned off, and the second control signal is further used for controlling the middle switch in the first bridge arm to be turned on and turned off; the third control signal and the first control signal are complementary and are used for controlling the lower switch of the second bridge arm to be turned on and turned off; and the fourth control signal and the second control signal are complementary and are used for controlling the lower switch of the first bridge arm to be turned on and turned off.

Preferably, wherein when the duty cycle of the first control signal or the second control signal is greater than 0.5, the two auxiliary switches are in a "Normally-Off" state; the third control signal is complementary to the first control signal and is used for controlling the middle switch of the first bridge arm and the lower switch of the second bridge arm to be turned on and turned off; and the fourth control signal is complementary to the second control signal and is used for controlling the switch of the second bridge arm and the lower switch of the first bridge arm to be turned on and turned off.

A power conversion device comprises a circuit substrate, an input end, an output end, switching components, a magnetic assembly and a grounding metal block, wherein the input end comprises an input positive terminal, an input negative terminal, wherein the output end comprises an output positive terminal and an output negative terminal, wherein the input negative terminal is electrically connected with the output negative terminal.

The magnetic assembly comprises a magnetic core and windings. The windings are arranged in the circuit substrate, wherein the magnetic assembly is electrically connected to the input end and the output end through the switching components respectively, and the magnetic assembly is disposed between the input end and the output end.

The grounding metal block is disposed on a surface of the circuit substrate, for short-connecting the input negative terminal and the output negative terminal.

The grounding metal block is disposed adjacent to one side edge of the magnetic assembly.

The power conversion device further comprises a heat dissipation block, wherein the heat dissipation block is welded on a first surface, and the grounding metal block is welded on a second surface.

A height of the heat dissipation block and a height of one of the switching components are the same.

The grounding metal block is parallelly connected with a grounding wire in the circuit substrate.

The magnetic assembly further comprises a first side edge and a second side edge, wherein the first side edge and the second side edge are opposite each other, wherein the input end is disposed adjacent to the first side edge, the output end is disposed adjacent to the second side edge, wherein the grounding metal block is disposed adjacent to another side edge of the magnetic assembly and extends from the first side edge to the second side edge.

Compared with the prior art, the application has the following beneficial effects:

1) By arranging the layout of the power conversion device, the loop area formed by the input capacitor and the switch bridge arm can be reduced, and the loop area formed by the input capacitor, the upper switch, the flying capacitor and the lower switch is further reduced, so that the inductor of the parasitic inductor and the resistance value of the parasitic resistor in each loop are reduced, and the voltage peak value of the two ends of the switch and the power loss of the power conversion device are effectively reduced;

(2) By adding the auxiliary circuit and adopting different control time sequences, when the input voltage is larger than or equal to four times of the output voltage, the auxiliary circuit does not affect the work of the six-switch flying capacitor voltage reduction type conversion circuit; and the input voltage can also be less than four times of the output voltage, the input voltage can provide energy for the output end through the auxiliary circuit only by changing the control time sequence, and the circuit structure is simple and easy to implement (3) three independently packaged drivers and a simple peripheral circuit are adopted, so that the driving control of the six switches is realized, and the area of the driving circuit on the circuit substrate in the power conversion device is reduced.

DESCRIPTION OF THE EMBODIMENTS

Figure 1:
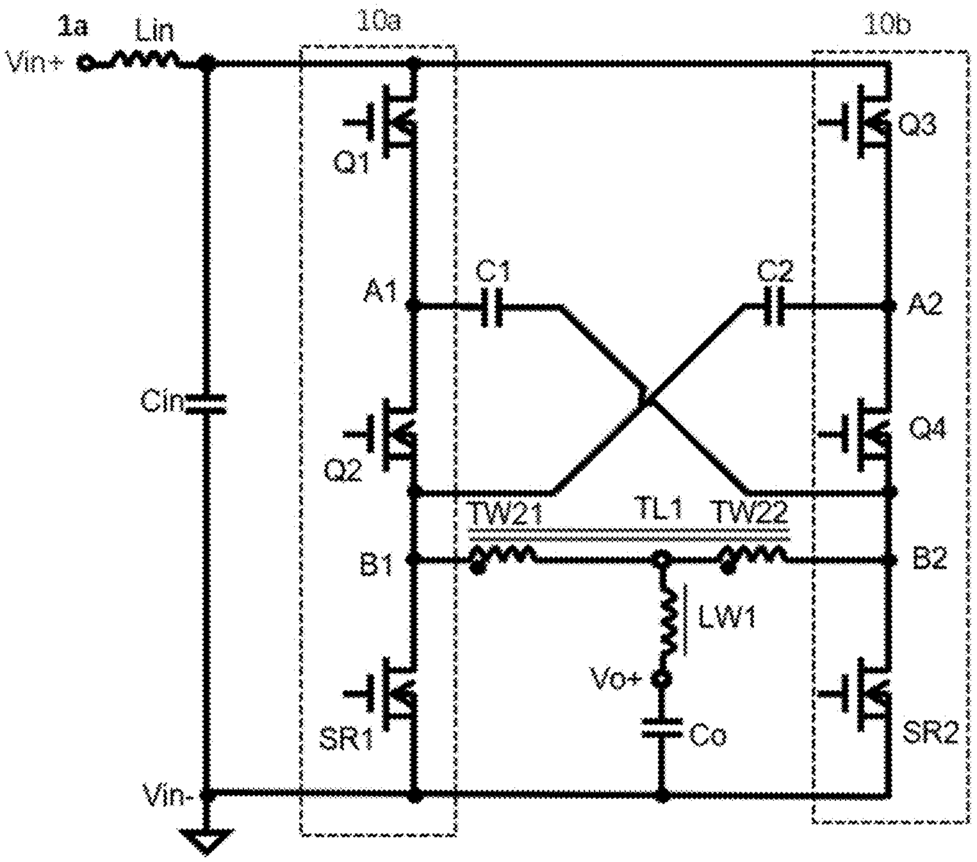
FIG. 1 is a schematic diagram of a six-switch power conversion circuit

The present application discloses various embodiments or examples of implementing the thematic technological schemes mentioned. To simplify the disclosure, specific instances of each element and arrangement are described below. However, these are merely examples and do not limit the scope of protection of this application. For instance, a first feature recorded subsequently in the specification formed above or on top of a second feature may include an embodiment where the first and second features are formed through direct contact, or it may include an embodiment where additional features are formed between the first and second features, allowing the first and second features not to be directly connected. Additionally, these disclosures may repeat reference numerals and/or letters in different examples. This repetition is for brevity and clarity and does not imply a relationship between the discussed embodiments and/or structures. Furthermore, when a first element is described as being connected or combined with a second element, this includes embodiments where the first and second elements are directly connected or combined with each other, as well as embodiments where one or more intervening elements are introduced to indirectly connect or combine the first and second elements.

One of the cores of the present application is to provide a power conversion device, which reduces parasitic parameters on a power transmission path by optimizing the layout of key components such as a transformer and an inductor, and improves the conversion efficiency of the power conversion device. The other core of the present application is to provide an auxiliary circuit, and when the input voltage is less than four times the output voltage, the input voltage can directly supply power to the output end by means of the auxiliary circuit.

The application discloses a six-switch flying-capacitor voltage-reduction-type power conversion circuit shown in FIG. 1, which can be applied to an intermediate bus power conversion device with 54V or 48V input and 12V voltage stabilization output. The power conversion circuit comprises an input positive terminal, an input negative terminal, an output positive terminal, an output negative terminal, two three-switch bridge arms, two flying capacitors, two transformer windings, an output inductor, an input capacitor and an output capacitor. Referring to the power conversion circuit 1*a* shown in FIG. 1, an input negative terminal Vin− and an output negative terminal Vo− short circuit; and the two three-switch bridge arms are respectively a first switch bridge arm 10*a* and a second switch bridge arm 10*b*, wherein the first switch bridge arm 10*a* comprises an upper switch Q1, a middle switch Q2 and a lower switch SR1; the upper switch Q1 and the middle switch Q2 are electrically connected to the upper node A1; the middle switch Q2 and the lower switch SR1 are electrically connected to the lower node B1; the drain electrode of the upper switch Q1 is electrically connected to the input positive terminal Vin+; the source electrode of the lower switch SR1 is electrically connected to the input negative terminal Vin−; the second switch bridge arm 10*b* comprises an upper switch Q3, a middle switch Q4 and a lower switch SR2, the upper switch Q3 and the middle switch Q4 are electrically connected to the upper node A2, the middle switch Q4 and the lower switch SR2 are electrically connected to the lower node B2, the drain electrode of the upper switch Q3 is electrically connected with the input positive terminal Vin+, and the source electrode of the lower switch SR2 is electrically connected with the input negative terminal Vin−; The input capacitor Cin is bridged between the input positive terminal Vin+ and the input negative terminal Vin−, and the output capacitor Co is bridged between the output positive terminal Vo+ and the output negative terminal Vo−; the flying capacitor C1 is bridged between the upper node A1 of the first switch bridge arm 10*a* and the lower node B2 of the second switch bridge arm 10*b*, and the flying capacitor C2 is bridged between the upper node A2 of the second switch bridge arm 10*b* and the lower node B1 of the first switch bridge arm 10*a*; and the first end of the transformer winding TW21 is electrically connected with the lower node B1, and the first end of the transformer winding TW22 is electrically connected with the lower node B2, the second end of the transformer winding TW21 and the second end of the transformer winding TW22 are electrically connected to the winding short contact TL1. The transformer winding TW21 and the transformer winding TW22 are coupled to one magnetic core, and the first end of the transformer winding TW21 and the second end of the transformer winding TW22 are dotted terminals (i.e, the two ends have the same polarity) and are marked as point ends. The coupling coefficient of the transformer winding TW21 and the transformer winding TW22 is close to an ideal transformer (equivalent to the coupling coefficient being close to 1), and the output inductor winding LW 1 is bridged between the winding short contact TL1 and the output positive terminal Vo+; wherein one end of the output inductor winding LW1 contacted with the short circuit contact TL1 of the winding is an input end of the output inductor winding LW1; and one end of the output inductor winding LW1 contacted with one end of the output positive terminal Vo+ short circuit are output ends of the output inductor winding LW1, and the output capacitor Co is bridged between the output positive terminal Vo+ and the output negative terminal Vo−.

Figure 2:
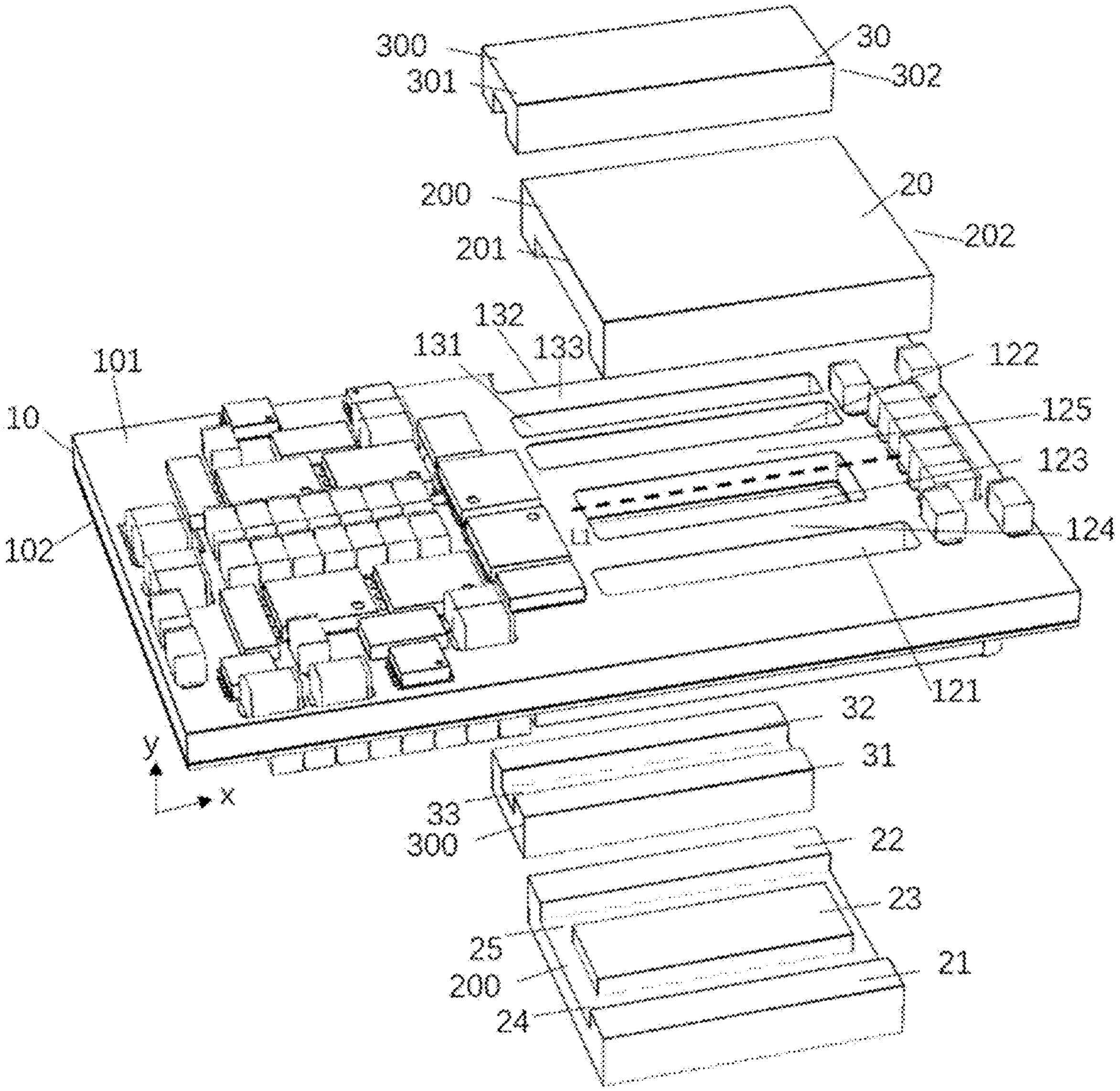
FIG. 2 is a three-dimensional exploded view of a power conversion device

The three-dimensional explosion diagram of the power conversion device disclosed by the application is shown in FIG. 2, and comprises a circuit substrate 10, a transformer magnetic core 20 and an output inductor magnetic core 30. The circuit substrate 10 comprises a first surface 101 and a second surface 102 which are opposite to each other. The transformer magnetic core 20 comprises two transformer magnetic substrates 200, transformer side columns 21/22 and a transformer middle column 23, wherein the transformer side columns 21/22 and the transformer middle column 23 are provided between two transformer magnetic substrates 200; the transformer middle column 23 is arranged between the transformer side columns 21 and 22; a transformer winding channel 24 is formed between the transformer middle column 23 and the transformer side column 21, and a transformer winding channel 25 is formed between the transformer middle column 23 and the transformer side column 22. The transformer windings penetrate through the transformer winding channels 24 and 25. The inductor magnetic core 30 comprises two inductor magnetic substrates 300 and inductor side columns 31 and 32, wherein the inductor side columns 31 and 32 are arranged between the two inductor magnetic substrates 300; and an inductor winding channel 33 is formed between the inductor side columns 31 and 32 for the inductor windings to penetrate through.

The circuit substrate 10 comprises transformer side column holes 121 and 122, a transformer middle column hole 123 and transformer side column holes 121 and 122, wherein the transformer middle column hole 123 penetrates through the first surface 101 and the second surface 102; the transformer side column holes 121 and 122 is allowed the transformer side columns 21 and 22 to penetrate through, and the transformer middle column hole 123 is used for the transformer middle column 23 to penetrate through. The circuit substrate 20 further comprises an inductor hole 131 and an inductor groove 132. The inductor hole 131 and the inductor groove 132 penetrate through the first surface 101 and the second surface 102. The inductor hole 131 is used for the inductor side column 31 to penetrate through, and the inductor groove 132 is used for outputting the inductor side column 32. The inductor groove 132 can also be an inductor hole, and the hole can also be designed into a groove according to actual requirements, and the groove is not limited thereto. On the circuit substrate 10, the transformer side column hole 121 and the transformer middle column hole 123 are in a transformer winding areas 124, the transformer side column hole 122 and the transformer middle column hole 123 are in a transformer winding area 125, and transformer winding areas 124 and 125 are allowed the transformer winding to penetrate through; the transformer middle column and the side column respectively penetrate through the corresponding holes, so that the transformer magnetic substrates are buckled with the circuit substrate 10 from the first surface 101 and the second surface 102 respectively, and the transformer magnetic core is coupled with the transformer winding to form a required transformer; the transformer magnetic core 20 further comprises a first transformer side edge 201 and a second transformer side edge 202 which are opposite to each other, wherein the transformer winding channels 24 and 25 penetrate through the first transformer side edge 201 and the second transformer side edge 202. The inductor hole 131 and the output inductor groove 132 are in an inductor winding area 133; the inductor winding area 133 is used for the output inductor winding to penetrate through; the inductor side columns penetrate through the corresponding hole and the groove respectively, so that the inductor magnetic substrates are respectively buckled with the circuit substrate 20 from the first surface 101 and the second surface 102, and the inductor magnetic core is coupled with the output inductor winding to form an output inductor; and the inductor magnetic core 30 further comprises a first inductor side edge 301 and a second inductor side edge 302 which are opposite to each other, and the inductor winding channel 33 penetrates through the first inductor side edge 301 and the second inductor side edge 302.

Figure 3A:
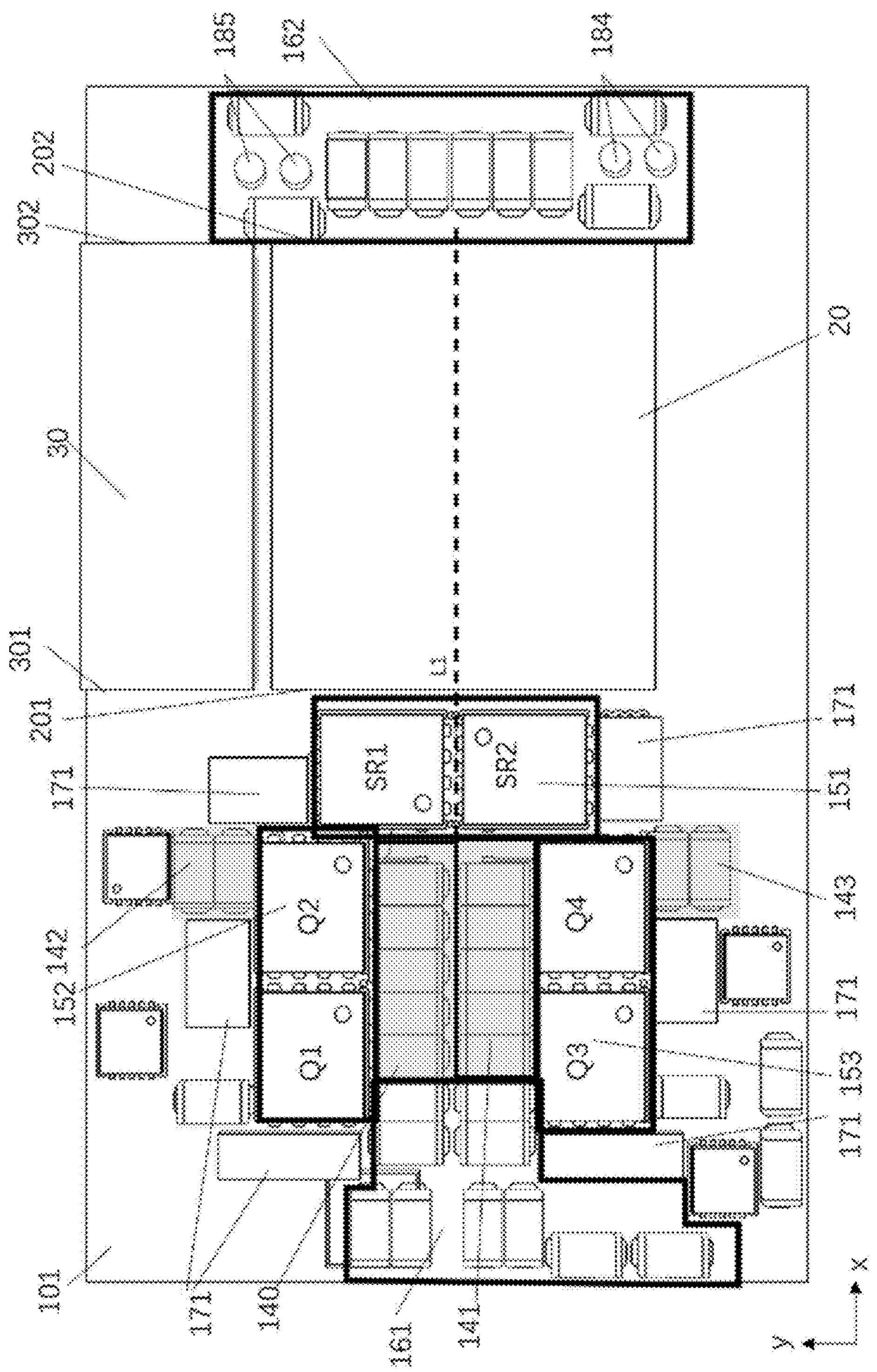
FIG. 3A is a schematic diagram of a top surface layout of a power conversion device.

FIG. 3A discloses a top surface layout schematic diagram of a power conversion device 1*a*. The first surface 101 of the circuit substrate 10 comprises a first flying capacitor area

140, a second flying capacitor region 141, a lower switch area 151, a first upper middle switch area 152, a second upper middle switch area 153, an input capacitor region 161 and an output area 162. The lower switch area 151 is used for setting lower switches SR1 and SR2; and the lower switches SR1 and SR2 are placed side by side in the Y-axis direction, and the lower switch area 151 is arranged adjacent to the first transformer side edge 201; the lower switch SR1 is arranged adjacent to the transformer winding area 125; and the lower switch SR2 is arranged adjacent to the transformer winding area 124, so that the drain electrodes of the lower switches SR1 and SR2 can be electrically connected with the first end of the transformer winding TW 21 and the first end of the TW22 respectively in the shortest path. According to the layout, the alternating current loop formed by the transformer winding and the lower switch can be minimum, the parasitic resistance and the parasitic leakage inductor of the alternating current loop are reduced, and the voltage peak value of the two ends of the switch and the power loss of the power conversion device are effectively reduced.

The first flying capacitor area 140 is used for providing a flying capacitor C1, and the second flying capacitor region 141 is used for providing a flying capacitor C2; the first flying capacitor area 140 and the second flying capacitor region 141 are arranged side by side, the first flying capacitor area 140 is arranged adjacent to the lower switch SR1, and the second flying capacitor region 141 is arranged adjacent to the lower switch SR2; a middle column line L1 exists on the first surface 101 of the circuit substrate 10. In the X-axis direction, the middle column line L1 penetrates through the transformer middle column hole 123. The lower switches SR1 and SR2 are arranged on the two sides of the middle column line L1 respectively, and the first flying capacitor area 140 and the second flying capacitor area 141 are also arranged on the two sides of the middle column line L1. The first upper middle switch area 152 is used for setting an upper switch Q1 and the middle switch Q2, and the second upper middle switch area 153 is used for arranging the upper switch Q3 and the middle switch Q4; the first upper middle switch area 152 is arranged adjacent to the first flying capacitor area 140, and the middle switch Q2 is arranged adjacent to the lower switch SR1. In the layout, the source electrode of the upper switch Q1 is arranged adjacent to the drain electrode of the middle switch Q2, the source electrode of the middle switch Q2 is arranged adjacent to the drain electrode of the lower switch SR1, and one end of the flying capacitor C1 is adjacent to the source electrode of the upper switch Q1 and the drain electrode of the middle switch Q2. Similarly, the second upper middle switch area 153 is arranged adjacent to the second flying capacitor region 141, and the middle switch Q4 is arranged adjacent to the lower switch SR2; the source electrode of the upper switch Q3 is arranged adjacent to the drain electrode of the middle switch Q4, the source electrode of the middle switch Q4 is arranged adjacent to the drain electrode of the lower switch SR2, and one end of the flying capacitor C2 is adjacent to the source electrode of the upper switch Q3 and the drain electrode of the middle switch Q4. The first upper middle switch area 152 and the second upper middle switch area 153 are respectively arranged on two sides of the middle column line L1; the input capacitor region 161 is adjacent to the first flying capacitor area 140, the second flying capacitor region 141, the first upper middle switch area 152 and the second upper middle switch area 153. In this way, the loop area formed by the input capacitor Cin and the first switch bridge arm 10*a* can be reduced, and the loop area formed by the input capacitor Cin and the second switch bridge arm 10*b* is reduced; the loop area formed by the input capacitor Cin, the upper switch Q1, the flying capacitor C1 and the lower switch SR2 is further reduced; and the loop area formed by the input capacitor Cin, the upper switch Q3, the flying capacitor C2 and the lower switch SR1 is further reduced, so that the parasitic inductors and the parasitic resistances in each loop are reduced, and the voltage peak value of the two ends of the switch and the power loss of the power conversion device are effectively reduced.

The first surface 101 of the circuit substrate 10 further comprises an output area 162, the output area 162 is used for setting an output capacitor Co, and the output positive terminal portion 185, the output negative terminal portion 184. In this embodiment a magnetic assembly comprises the transformer magnetic core 20 and the output inductor magnetic core 30, the transformer magnetic core 20 and the output inductor magnetic core 30 are placed side by side in the Y-axis direction to form a magnetic assembly. The first transformer side edge 201 and the first inductor side edge 301 are located on the same side of the magnetic assembly, and that is a first side edge of the magnetic assembly; the second transformer side edge 202 and the second inductor side edge 302 are located on the same side of the magnetic assembly and that is a second side edge of the magnetic assembly; and the first side edge of the magnetic assembly is opposite to the second side edge of the magnetic assembly. The first side edge of the magnetic assembly is adjacent to the lower switch area 151, so that the lower switch area 151 is adjacent to the first transformer side edge 201. The second side edge of the magnetic assembly is adjacent to the output area 162, such that the output positive terminal 185 is adjacent to the second output inductor side edge 302. A detailed winding mode (not shown) of the transformer winding and the inductor winding is as follows: a first end of the transformer winding TW21, a first end of the transformer winding TW22 and a winding short contact TL1 are arranged adjacent to the first transformer side edge 201. The transformer winding starts from the first end of the transformer winding TW21 to the first end of the transformer winding TW22, penetrates through the transformer winding area 125 to reach the second transformer side edge 202, then penetrates through the transformer winding area 124 to reach the winding short contact TL1 adjacent to the first transformer side edge 201, then continues to penetrate through the winding area 125 to reach the second transformer side edge 202, and then penetrates through the transformer winding area 124 to reach the first end of the transformer winding TW 22 arranged on the first transformer side edge 201. An input end of the output inductor winding LW 1 is adjacent to the first output inductor side edge 301. An output end of the output inductor winding LW 1 is adjacent to the second output inductor side edge 302. The output inductor winding LW 1 starts from the input end to the output end, penetrates through the output inductor winding area 133 to reach the second output inductor side edge 302, that is to the output end of the output inductor winding LW 1, and is short-circuited with the output positive terminal portion 185. In the layout method of the transformer magnetic core 20 and the output inductor 30, the first end of the transformer winding TW 21, the first end of the transformer winding TW 22, the winding short contact TL 1 and the input end of the output inductor winding LW 1 are all arranged closest to first side edge of the magnetic assembly, so that the shortest distance short circuit between the winding short contact TL 1 and the input end of the output inductor winding LW 1 can be realized; the output end of the output inductor winding LW1 is arranged closest to second side edge of the magnetic assembly, and the shortest distance is realized with the output positive terminal portion 185; and the parasitic resistance of the magnetic core assembly winding is effectively reduced.

The first surface 101 of the circuit substrate 10 further comprises a third flying capacitor area 142 and a fourth flying capacitor area 143, and the third flying capacitor area 142 and the fourth flying capacitor area 143 are respectively arranged on two sides of the middle column line L1. The third flying capacitor area 142 is used for setting a flying capacitor C1, and the third flying capacitor 142 and the first upper middle switch area 152 are located on the same side of the middle column line L1, so that the first upper middle switch area 152 is arranged between the first flying capacitor area 140 and the third flying capacitor area 142; the fourth flying capacitor area 143 is used for setting a flying capacitor C2, and the fourth flying capacitor area 143 and the second upper middle switch area 153 are located on the same side of the extension line L1, so that the second upper middle switch area 153 is arranged between the second flying capacitor area 141 and the fourth flying capacitor area 143. The first surface 101 of the circuit substrate 10 further comprises at least one heat dissipation block 171, and the heat dissipation block 171 is welded on the first surface 101 and is adjacent to a heating component (such as an upper switch Q1/Q3, a middle switch Q2/Q4 and a lower switch SR1/SR2); the height of the heat dissipation block 171 is close to the height of the heating component, and the bonding pad of the heat dissipation block 171 is electrically connected with the heat dissipation bonding pad of the heating component, so that the thermal resistance between the heat dissipation block 171 and the heating component is small, and the temperature difference is low, so that part of loss of the heating component penetrates through the heat dissipation block 171 and dissipated through temperature equalization plate or the radiator at the top of the heat dissipation block 171.

Figure 3B:
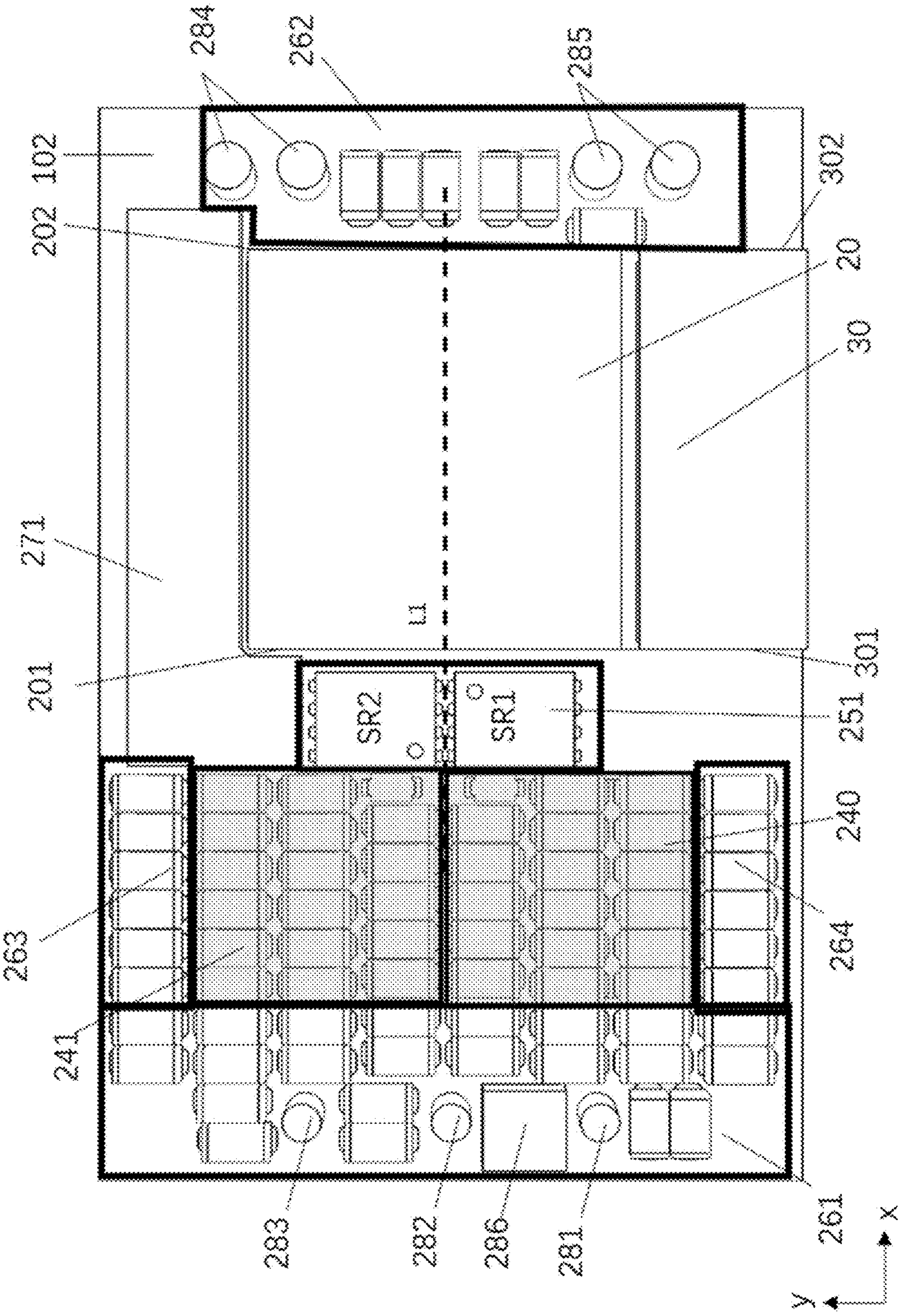
FIG. 3B is a schematic diagram of a bottom surface layout of a power conversion device.

FIG. 3B discloses a schematic diagram of the bottom surface layout of the power conversion device 1*a*, the second surface 102 of the circuit substrate 10 comprises a lower switch area 251, a fifth flying capacitor area 240, a sixth flying capacitor area 241, an input area 261, a first input capacitor area 263, a second input capacitor area 264 and an output area 262; the switch area 251 is arranged adjacent to the first transformer side edge 201, and is used for arranging the lower switches SR1 and SR2; and the lower switches SR1 and SR2 are placed side by side in the Y-axis direction. The lower switch SR1 is arranged adjacent to the transformer winding area 125, and the lower switch SR2 is arranged adjacent to the transformer winding area 124, so that the drains of the lower switches SR1 and SR2 can be electrically connected with the first end of the transformer winding TW21 and the first end of the TW22 respectively in the shortest path; the fifth flying capacitor area 240 is used for setting a flying capacitor C1, and the fifth flying capacitor area 240 is arranged adjacent to the lower switch SR1; the sixth flying capacitor area 241 is used for setting a flying capacitor C2, and the sixth flying capacitor area 241 is arranged adjacent to the lower switch SR2; the input area 261 is used for setting an input capacitor Cin, an input positive terminal portion 281/282 and an input negative terminal portion 283, and the input inductor 286 is arranged adjacent to the input positive terminal portion 281 or 282. The first input capacitor area 263 is arranged adjacent to the sixth flying capacitor area 241 and the input area 261, and the second input capacitor area 264 is arranged adjacent to the fifth flying capacitor area 240 and the input area 261. The output area 262 is provided with an output capacitor Co, an output positive terminal portion 285 and an output negative terminal portion 284, and the output 262 is arranged adjacent to the second transformer side edge 202 and the second output inductor side edge 302, so that the output capacitor Co and the output positive terminal portion 285 are arranged close to one end of the inductor winding, so that the parasitic parameters on the power transmission path are reduced, and the power loss is reduced.

The second surface 102 of the circuit substrate 10 further comprises a grounding metal block 271. The grounding metal block 271 is welded on the second surface 102, is connected in parallel with a wiring corresponding to the inner layer of the circuit substrate 10, and is used for reducing the parasitic resistance between the input negative terminal portion 283 and the output negative terminal portion 284.

Referring to FIG. 3A and FIG. 3B, the lower switch SR1 provided on the first surface 101 is electrically connected in parallel to the lower switch SR1 provided on the second surface 102, and the projection on the first surface 101 of the lower switch SR1 provided on the first surface 101 is at least partially overlapped with the projection on the first surface 101 of the lower switch SR1 provided on the second surface 102; the lower switch SR2 arranged on the first surface 101 is electrically connected with the lower switch SR2 arranged on the second surface 102 in parallel, and the projection on the first surface 101 of the lower switch SR2 arranged on the first surface 101 is at least partially overlapped with the projection on the first surface 101 of the lower switch SR2 arranged on the second surface 102. The projection of the fifth flying capacitor area 240 on the first surface 101 is at least partially overlapped with the first flying capacitor area 140; and the projection of the sixth flying capacitor area 241 on the first surface 101 is at least partially overlapped with the second flying capacitor area 141. A projection of the input area 261 on the first surface 101 is at least partially overlapped with the input area 161. The projection of the output area 262 on the first surface 101 is at least partially overlapped with the output area 162.

Figure 4A:
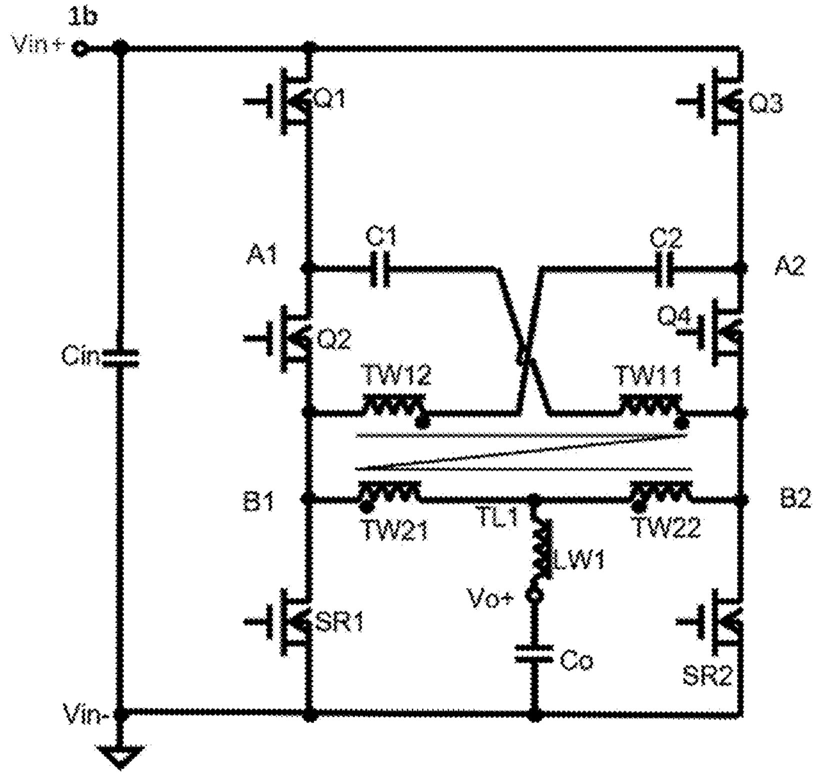
FIG. 4A to FIG. 4C are schematic diagrams of an expanded embodiment of a layout.
Figure 4B:
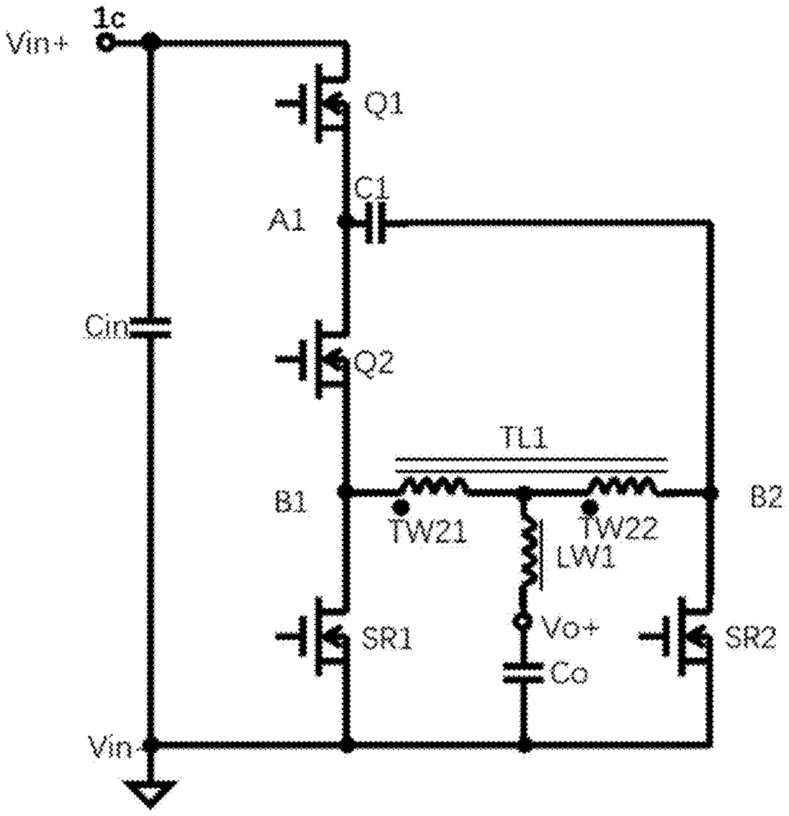
Figure 4C:
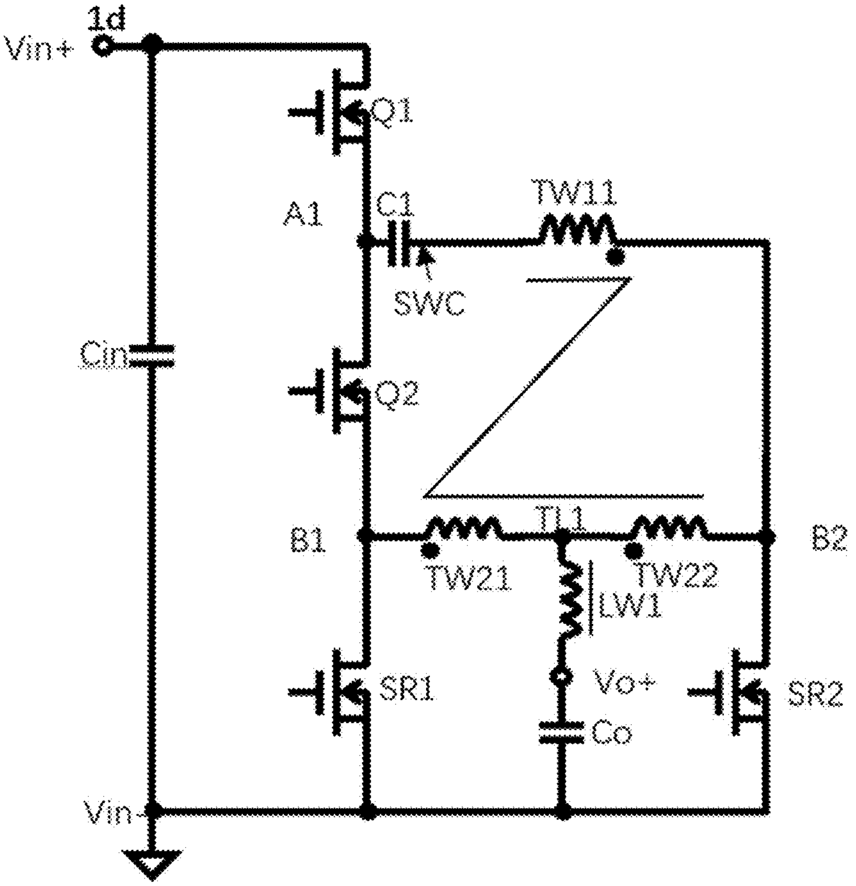

The layout shown in the embodiment is also suitable for a six-switch flying capacitor voltage-reduction circuit as shown in FIG. 4A. The circuit shown in FIG. 4A is different from the circuit shown in FIG. 1 in that high-voltage windings TW11 and TW 12 are added, the other circuit is the same as the circuit shown in FIG. 1. The layout method shown in FIG. 3A and FIG. 3B can also be adopted, the advantages brought by the layout of the embodiment can also be obtained, and details are not described herein again. The layout method shown in FIG. 3A and FIG. 3B is also suitable for the four-switch flying-capacitor voltage-reduction circuit shown in FIG. 4B and FIG. 4C. The circuit shown in FIG. 4B differs from the circuit shown in FIG. 1 in that an upper switch, a middle switch and a flying capacitor are removed; the circuit layout shown in FIG. 4B can remove the second upper middle switch area, the second flying capacitor area, the fourth flying capacitor area and the sixth flying capacitor area are removed on the basis of the layout shown in FIG. 3A and FIG. 3B, and the layout shown in FIG. 3A and FIG. 3B can be adopted. The circuit shown in FIG. 4C is different from the circuit shown in FIG. 4B in that a high-voltage winding TW11 is added, the layout of the high-voltage winding TW11 can also adopt the layout of the circuit shown in FIG. 4B, and the advantages brought by the layout of the embodiment can also be obtained, and details are not described herein again.

Figure 5:
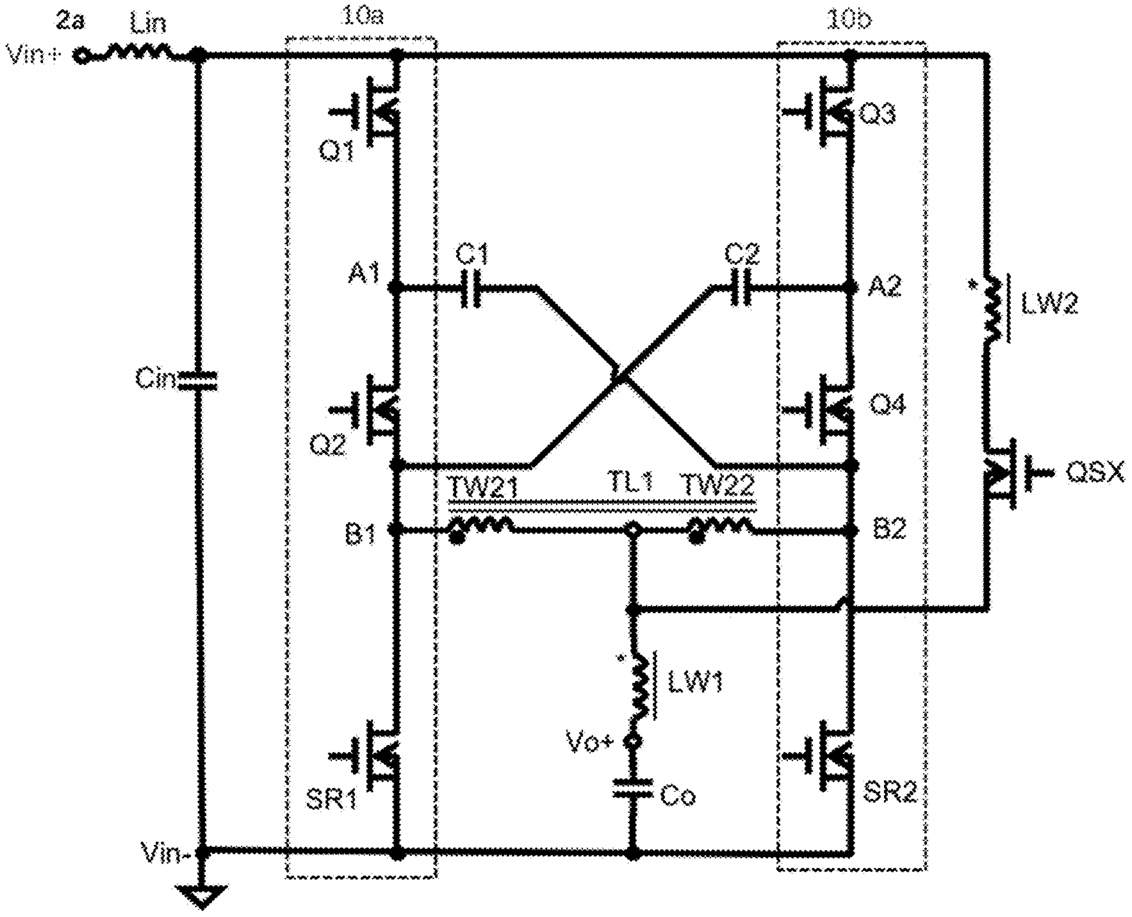
FIG. 5 is a schematic diagram of a six-switch power conversion circuit for adding an auxiliary switch and an auxiliary winding.
Figure 6A:
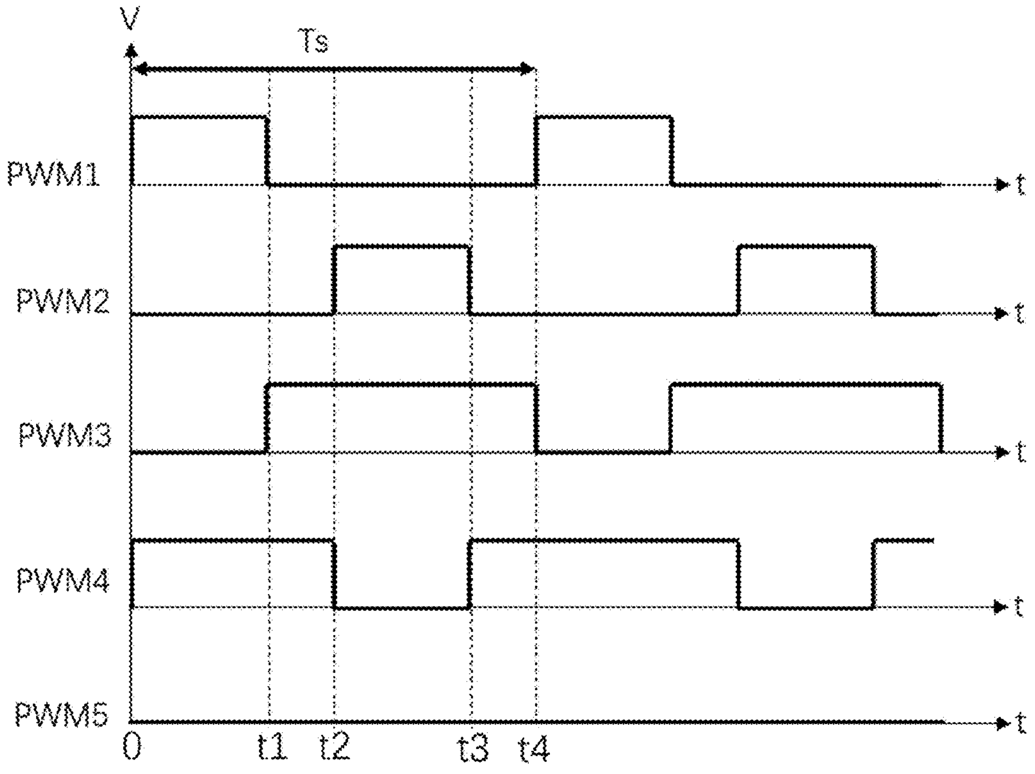
FIG. 6A is a schematic diagram of a control timing sequence when Vin≥4*Vo.

In order to solve the problems that the large range of the input voltage, the reduced output voltage caused by over-low input power when the input voltage is lower than four times of the output voltage. On the basis of the six-switch flying-capacitor voltage-reduction type power conversion circuit shown in FIG. 1, an auxiliary switch QSX and an auxiliary winding LW2 are added, as shown in FIG. 5. The auxiliary winding LW2 and the inductor winding LW 1 are wound on one magnetic core, one end of the auxiliary winding LW2 is electrically connected with the input positive terminal Vin+, the other end of the auxiliary winding LW2 is electrically connected with the drain electrode of the auxiliary switch QSX, and the source electrode of the auxiliary switch QSX is electrically connected with the output positive terminal Vo+. The auxiliary winding LW2 is connected to the input positive terminal Vin+, and the input terminal of the auxiliary winding LW2 and the input terminal of the inductor winding LW1 are dotted terminals, and are labeled as * terminals. The power conversion device further comprises a first control signal PWM1, a second control signal PWM2, a third control signal PWM3 and a fourth control signal PWM4; and when the input voltage Vin is greater than or equal to four times of the output voltage, as shown in FIG. 6A, the first control signal PWM1 is used for controlling the turn-on and turn-off of the upper switch Q1 and the middle switch Q4; the second control signal PWM2 is used for controlling the turn-on and turn-off of the upper switch Q3 and the middle switch Q2; the duty ratio of the first control signal PWM1 and the duty ratio of the second control signal PWM2 are equal and are less than or equal to 50%, and the first control signal PWM1 and the second control signal PWM2 are staggered by 180 degrees. The third control signal PWM3 is complementary to the first control signal PWM1 (ignoring the dead time between PWM1 and PWM3), and is used for controlling the turn-on and turn-off of the lower switch SR2; and the fourth control signal PWM4 is complementary to the second control signal PWM2 (ignoring the dead time between PWM4 and PWM2) and is used for controlling the turn-on and turn-off of the lower switch SR1. The power conversion device further comprises a fifth control signal PWM5, the fifth control signal PWM5 is used for controlling the turn-on and turn-off of the auxiliary switch QSX. Under the condition that the input voltage Vin is greater than or equal to four times of the output voltage, the fifth control signal PWM5 is always at a low level, and at the moment, the auxiliary switch QSX is in "off" state, that is, the auxiliary switch QSX is in a non-working state. At the moment, the gain between the output voltage Vo and the input voltage Vin meets Vo=Vin*D/2; the duty ratio D is the duty ratio of the first control signal PWM1, and the duty ratio D appearing below is the duty ratio of the first control signal PWM1. When the duty ratio D is equal to the maximum value of 0.5, the output voltage Vo reaches the maximum value Vin/4.

Figure 6B:
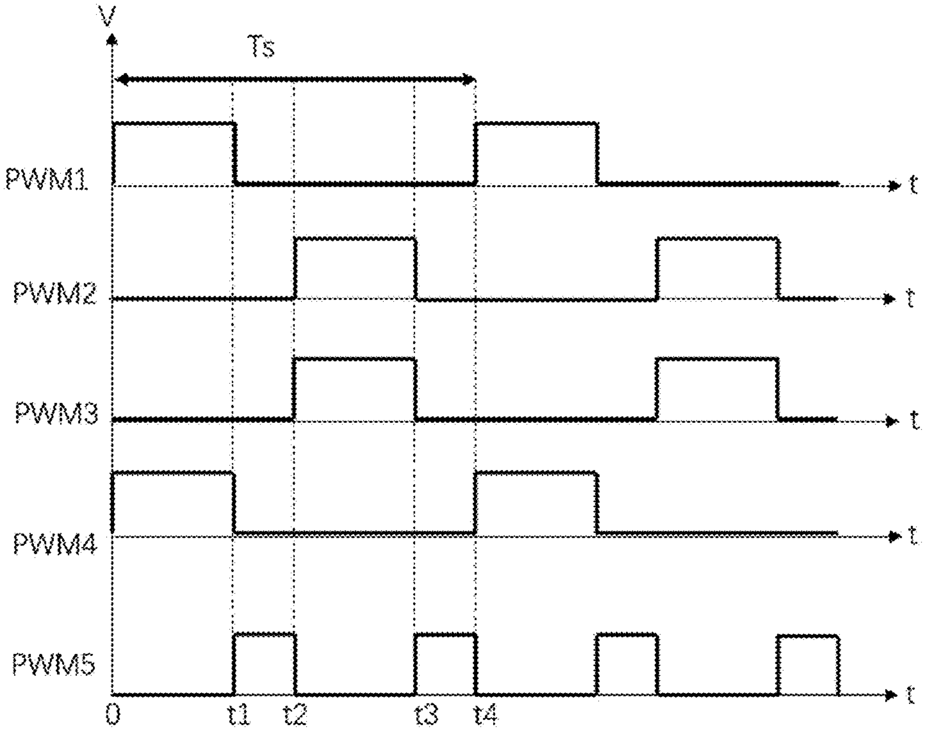
FIG. 6B is a schematic diagram of a control timing sequence when Vin<4*Vo.

When the input voltage Vin is less than four times of the output voltage, the control time sequence disclosed by the application is shown in FIG. 6B. The first control signal PWM1 is used for controlling the turn-on and turn-off of the upper switch Q1 and the middle switch Q4; the second control signal PWM2 is used for controlling the turn-on and turn-off of the upper switch Q3 and the middle switch Q2; the duty ratio of the first control signal PWM1 and the duty ratio of the second control signal PWM2 are equal and they are less than or equal to 50%, and the first control signal PWM1 and the second control signal PWM2 are staggered by 180 degrees. The third control signal PWM3 is the same as the second control signal PWM2 and is used for controlling the on and off of the lower switch SR2; and the fourth control signal PWM4 is the same as the first control signal PWM1 and is used for controlling the "On" and "Off" of the lower switch SR1. In a switching period Ts (such as an interval between time 0 and time T4) as shown in FIG. 6B, within the first half switching period, ie, intervals 0 to t2, the fifth control signal PWM5 is complementary to the first control signal PWM1 (ignoring dead time between PWM5 and PWM1); and in the last half of the switching period, namely intervals t2-t4, the fifth control signal PWM5 is complementary to the second control signal PWM2 (ignoring the dead time between PWM5 and PWM2); and the fifth control signal PWM5 is used for controlling the turn-on and turn-off of the auxiliary switch QSX. The fifth control signal PWM5 is in a high-level interval, namely, intervals t1-t2 and intervals t3-t4; and the input voltage Vin directly transfers energy to the output end through the auxiliary winding LW2 and the auxiliary switch QSX, so that the problem of reduced output voltage when the input voltage Vin is lower than 4 times of the output voltage can be solved. Specifically, if the number of turns of the inductor winding LW1 is 1, the number of turns of the auxiliary winding LW2 is selected to be 1, and at this time, the gain between the output voltage Vo and the input voltage Vin satisfies Vo=(Vin/2)−(Vin*D/2). When the input voltage Vin decreases, the duty cycle D of the first control signal PWM1 can be reduced, and the required value of the output voltage Vo can also be obtained; when the duty ratio D is equal to the maximum value 0.5, the output voltage Vo reaches the minimum value Vin/4. According to the method of adding the auxiliary circuit (the auxiliary winding LW2 and the auxiliary switch QSX series circuit), different control time sequences are adopted, so that when the input voltage Vin is larger than or equal to four times of the output voltage, the auxiliary circuit does not affect the work of the six-switch flying-capacitor voltage-reduction type conversion circuit; and when the input voltage Vin is less than four times of the output voltage, the input voltage can transfer energy for the output end through the auxiliary circuit only by changing the control time sequence in an interval (in this interval the auxiliary switch QSX operates) and the circuit structure is simple and easy to implement.

Figure 7:
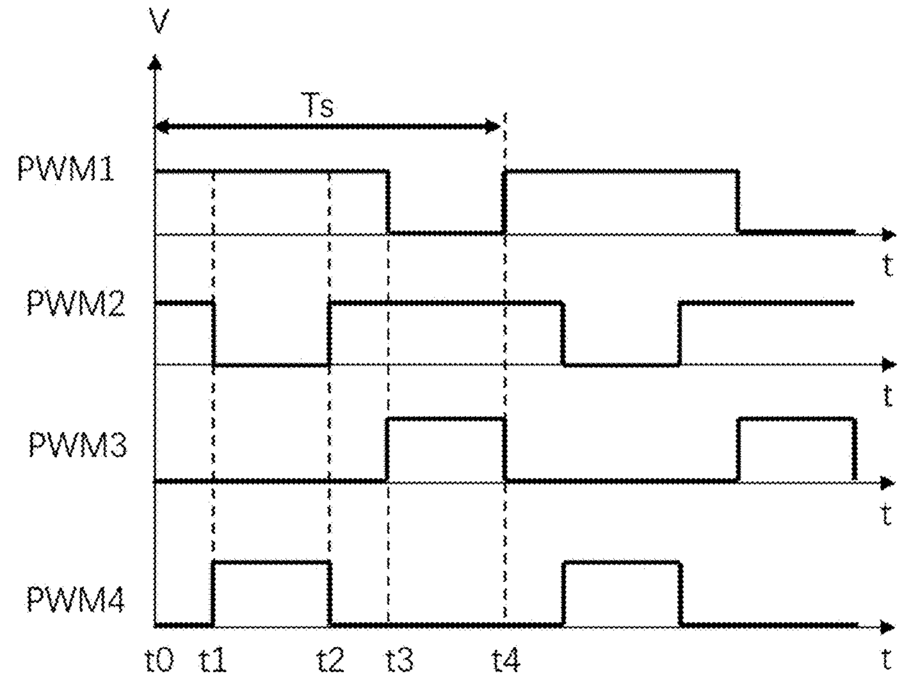
FIG. 7 is a schematic diagram of a control time sequence when D>0.5.

According to the circuit topology 1*a* shown in FIG. 1, the duty ratio D can be adjusted, so that the duty ratio D of the power conversion device is greater than 0.5, so that the problem of the reduced output voltage due to the fact that the over-low input voltage is solved. The control strategy is shown in FIG. 7, the duty ratios of the first control signal PWM1 and the second control signal PWM2 are greater than 0.5, and the first control signal PWM1 and the second control signal PWM2 are staggered by 180 degrees. The third control signal PWM3 is complementary to the first control signal PWM1, and the fourth control signal PWM4 is complementary to the first control signal PWM1. The first control signal PWM1 is used for controlling the turn-on and turn-off of the upper switch Q1, the second control signal PWM2 is used for controlling the turn-on and turn-off of the upper switch Q3, the third control signal PWM3 is used for turn-on and turn-off the middle switch Q2 and the lower switch SR2, and the fourth control signal PWM4 is used for turn-on and turn-off the middle switch Q4 and the lower switch SR1. The control strategy as described above may enable the output voltage to meet the demand when the input voltage is reduced. When the upper switch Q1 is turned off, the flying capacitors C1 and C2 are connected in series, and the voltages at the two ends of the two flying capacitors (V_C1+V_C2) are larger than the voltage V_Cin at the two ends of the input capacitor, so that the voltage at the two ends of the two flying capacitors generates voltage impact on the voltage at the two ends of the input capacitor, and extra loss caused by capacitor voltage impact is generated; and similarly, the same problem exists when the upper switch Q3 is disconnected.

Figure 8:
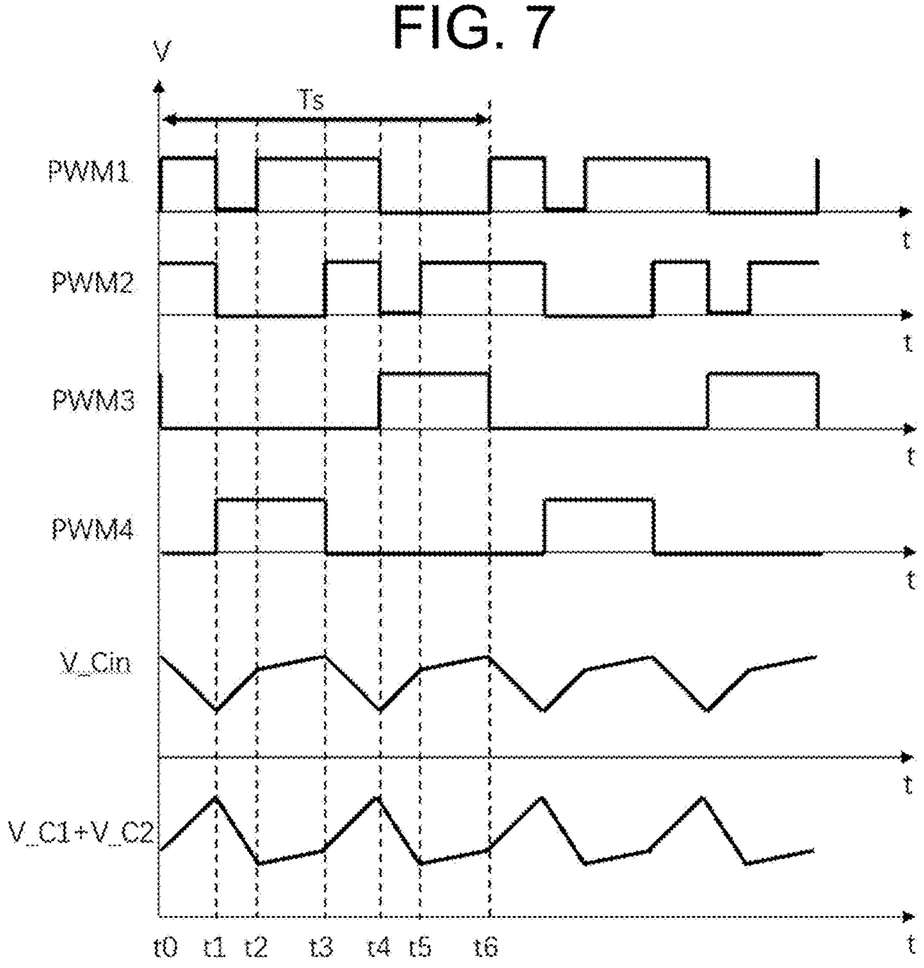
FIG. 8 is another schematic diagram of a control time sequence when D>0.5.

In order to solve the problems caused by the control strategy, the application discloses a new control strategy. The control strategy shown in FIG. 8 differs from the control strategy shown in FIG. 7 in that when the upper switch Q3 is turned off at the moment t1, the upper switch Q1 is turned off at the same time; at the moment, only the middle switch Q4 and the lower switch SR1 are in "On" state, the flying capacitor C2 starts discharging to the output end, and the voltage across the flying capacitor C2 is reduced. As shown in FIG. 8, in the intervals t1-t2, the value of V_C1+V_C2 is reduced; and meanwhile, the upper switches Q1 and Q3 are turned off, so that the input capacitor Cin stops discharging and starts charging at the moment t1, and as shown in the figure, the V_Cin starts to rise at the moment t1. When V_Cin is equal to V_C1+V_C2 (namely at the t2 moment), the upper switch Q1 is turned on again, so that voltage impact on the input capacitor Cin after the flying capacitors C1 and C2 are connected in series can be avoided. Similarly, in the interval t4-t5, when the upper switch Q1 is turned off, the upper switch Q3 is turned off too, and the flying capacitor C1 starts discharging to the output end at the same time, and when V_Cin=V_C1+V_C2 (namely at the t5 moment), the upper switch Q3 is turned on again. According to the embodiment of the application, the upper switches Q1 and Q3 can select the Si MOSFET, the GaN MOSFET is used as the optimal. Because the body diode conduction voltage drop of the GaN MOSFET is large, in the interval of Q1 and Q3 are both turned off, the voltage impact on the input capacitor Cin can completely avoid after the flying capacitors C1 and C2 are connected in series, so that the loss generated by the voltage impact of the capacitor is reduced to zero.

Figure 9:
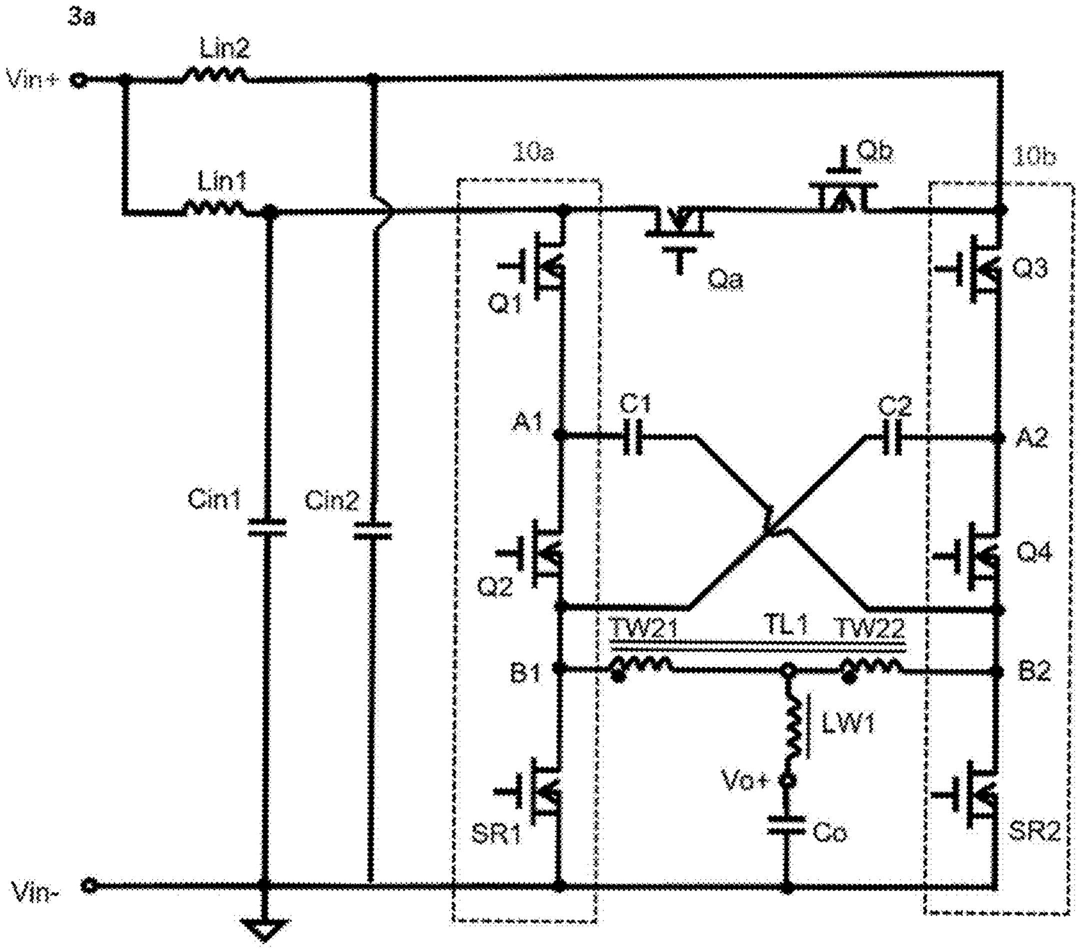
FIG. 9 is a schematic circuit diagram of another embodiment.

The application further discloses another circuit topology 3*a* and a corresponding control strategy, which are used for solving the problem that the output voltage is reduced when the input voltage is too low. Specifically, as shown in FIG. 9, and refer to the control strategy shown in FIG. 7, the difference between the circuit topology 3*a* and the circuit topology 1*a* is that the circuit topology 3*a* further comprises two input inductors Lin1 and Lin2, two input capacitors Cin1 and Cin2, and auxiliary switches Qa and Qb. The first ends of the input inductor Lin1 and the first end of the Lin2 are electrically connected to the input positive terminal Vin+, the second end of the input inductor Lin1 is electrically connected to the positive terminal of the input capacitor Cin1 and the drain electrode of the upper switch Q1, and the second end of the input inductor Lin2 is electrically connected to the positive terminal of the input capacitor Cin2 and the drain electrode of the upper switch Q3; the negative terminal s of the input capacitors Cin1 and Cin2 are electrically connected to the input negative terminal Vin−. The source electrodes of the auxiliary switches Qa and Qb can be connected, or the drain electrodes of the two auxiliary switches can also be connected. The common-source connection is taken as an example for description, the drain electrode of the auxiliary switch Qa is electrically connected with the drain electrode of the upper switch Q1, and the drain electrode of the auxiliary switch Qb is electrically connected with the drain electrode of the upper switch Q3. If the auxiliary switches Qa and Qb are in the common-drain connection, the source electrode of the auxiliary switch Qa is electrically connected to the drain electrode of the upper switch Q1, and the source electrode of the auxiliary switch Qb is electrically connected to the drain electrode of the upper switch Q3.

In the circuit topology 3*a* shown in FIG. 9, in a working state where the duty ratio is less than or equal to 0.5, the auxiliary switches Qa and Qb are in a "Normally-On" state, that is, as shown in FIG. 6A, the working principle is the same as the first control strategy to the fourth control strategy shown in FIG. 6A in combination with the circuit topology 1A. In a working state where the duty ratio is greater than 0.5, the auxiliary switches Qa and Qb are in a "Normally-Off" state, and at this time, the driving waveforms of the switches of the power conversion device are shown in FIG. 7. The duty cycles of the first control signal PWM1 and the second control signal PWM2 are the same and greater than 0.5, and the first control signal PWM1 and the second control signal PWM2 are staggered by 180 degrees; the third control signal PWM3 is complementary to the first control signal PWM1, and the fourth control signal PWM4 and the first control signal PWM1 are staggered by 180 degrees. The first control signal PWM1 is used for controlling the turn-on and turn-off of the upper switch Q1, the second control signal PWM2 is used for controlling the turn-on and turn-off of the upper switch Q3, the third control signal PWM3 is used for turning on and turning off the middle switch Q2 and the lower switch SR2, and the fourth control signal PWM4 is used for turning on and turning off the middle switch Q4 and the lower switch SR1. In the interval t1-t2, the upper switch Q1, the middle switch Q4 and the lower switch SR1 are in an "On" state, the input capacitor Cin1 discharges to the output end, and the voltage V_Cin1 at the two ends of the input capacitor Cin1 is reduced; meanwhile, the upper switch Q3 is in an "Off" state, the input capacitor Cin2 is in a charging state, and the voltage V_Cin2 at the two ends of the input capacitor Cin2 rises. In the interval t2-t3, the upper switch Q1 and the upper switch Q3 are both in an "On" state, so that the input capacitor Cin1 and the input capacitor Cin2 discharge to the output end. The voltages of the input capacitor Cin1 and the input capacitor Cin2 are both reduced. At the time t3, the upper switch Q3, the middle switch Q2 and the lower switch SR2 are turned on, and when the upper switch Q1 is turned off, the flying capacitors C1 and C2 are connected in series again, and the voltages at the two ends of the flying capacitors C1 and C2(V_C1+V_C2) impact on the input capacitor Cin2. Compared with the circuit topology 1*a* in combination with the control strategy in FIG. 7, in the combination of the circuit topology 3*a* and the control strategy in FIG. 7, the falling amplitude of the voltage V_Cin2 at the two ends of the input capacitor Cin2 is greatly reduced, so that the amplitude of the impact voltage is also greatly reduced, and the impact loss of the capacitor voltage is also greatly reduced. Similarly, at the moment t1, the upper switch Q3 is turned off, and when the upper switch Q1, the middle switch Q4 and the lower switch SR1 are turned on, the voltages at the two ends of the flying capacitors C1 and C2(V_C1+V_C2) impact on the input capacitor Cin1. Compared with the combination of the circuit topology 1*a* and the control strategy in FIG. 7, the combination of the circuit topology 3*a* and the control strategy in FIG. 7, the falling amplitude of the voltage V_Cin1 at the two ends of the input capacitor Cin1 is greatly reduced, so that the amplitude of the impact voltage is also greatly reduced, and the impact loss of the capacitor voltage is also greatly reduced.

All circuit topologies disclosed by the application comprise six switches, namely two upper switches, two middle switches and two lower switches. The application discloses a driving circuit for driving and controlling the six switches. The driving circuit comprises three drivers, four driving diodes and four driving capacitors. The driver Dr1 is used for driving two upper switches Q1 and Q3, the driver Dr2 is used for driving a middle switch Q2 and a lower switch SR1 of one bridge arm, and the driver Dr3 is used for driving a middle switch Q4 and a lower switch SR2 of the other bridge arm.

The driver Dr2 and Dr3 are half-bridge drivers, the positive electrode of the driving diode Dd1 is electrically connected with the power supply pin VDD of the driver Dr2, the negative electrode of the driving diode Dd1 is electrically connected with the pin HB, the driving capacitor Cd1 is electrically connected between the pin HB and the pin HS of the driver Dr2, the pin HS is electrically connected with the lower node B1, the pin HB is electrically connected with the connecting point E1, and the input ends HB and HO are electrically connected with the two control signals in the first control signal to the fourth control signal respectively. Similarly, the positive electrode of the driving diode Dd2 is electrically connected to the power supply pin VDD of the driver Dr3, the negative electrode of the driving diode Dd2 is electrically connected to the pin HB of the driver Dr3, the driving capacitor Cd2 is electrically connected between the pin HB and the pin HS of the driver Dr2, the pin HS is electrically connected to the lower node B2, the pin HB is electrically connected to the connection point E2, and the pins HB and HO are electrically connected to two control signals in the first control signal to the fourth control signal respectively. The driver Dr1 is a floating-ground driver and comprises two floating-ground driving circuits and a grounding pin GND, and the two floating-ground driving circuits are used for outputting two floating-ground driving signals so as to drive the two upper switches. Specifically, the driver Dr1 includes two floating ground pins HS1 and HS2, two driving pins HO1 and HO2, two floating ground power supply pins HB1 and HB2, a power supply pin VDD with a ground pin GND as a reference, and two input signal pins HL1 and HL2 with a ground pin GND as a reference are respectively shorted to the upper nodes A1 and A2, and the two floating pins HS1 and HS2 are respectively short-connected to the upper nodes A1 and A2, the two driving pins HO1 and HO2 are electrically connected with the gates of the two upper switches respectively, the two floating ground power supply pins HB1 and HB2 are respectively referenced by the floating pins HS1 and HS2, power suppling to the two driving pins HO1 and HO2, and the input signal pins HL1 and HL2 are used for receiving two control signals from the first control signal to the fourth control signal. The positive electrode of the driving diode Dd3 is electrically connected with the connection point E1, the negative electrode of the driving diode Dd3 is electrically connected with the floating ground power supply pin HB1 of the driver Dr1, and the driving capacitor Cd3 is electrically connected between the floating ground power supply pin HB1 and the floating ground pin HS1. The floating ground power supply pin HB1 is electrically connected with the connecting point F1, the floating ground pin HS1 is electrically connected with the upper node A1. The positive electrode of the driving diode Dd4 is electrically connected with the connecting point E2, the negative electrode of the driving diode Dd2 is electrically connected with the floating ground power supply pin HB2 of the driver Dr1, and the driving capacitor Cd4 is electrically connected between the floating ground power supply pin HB2 and the floating ground pin HS2; wherein the floating ground power supply pin HB2 is electrically connected with the connection point F2, and the floating ground pin HS2 is electrically connected with the upper node A2. The driving circuit disclosed by the application only comprises three independently packaged drivers, so that the driving control of the six switches is completed, and the number of independent packaging drivers is reduced; and the number of devices in the peripheral circuit is small, and the area of the driving circuit on the circuit substrate in the power conversion device is further reduced.

Figure 10:
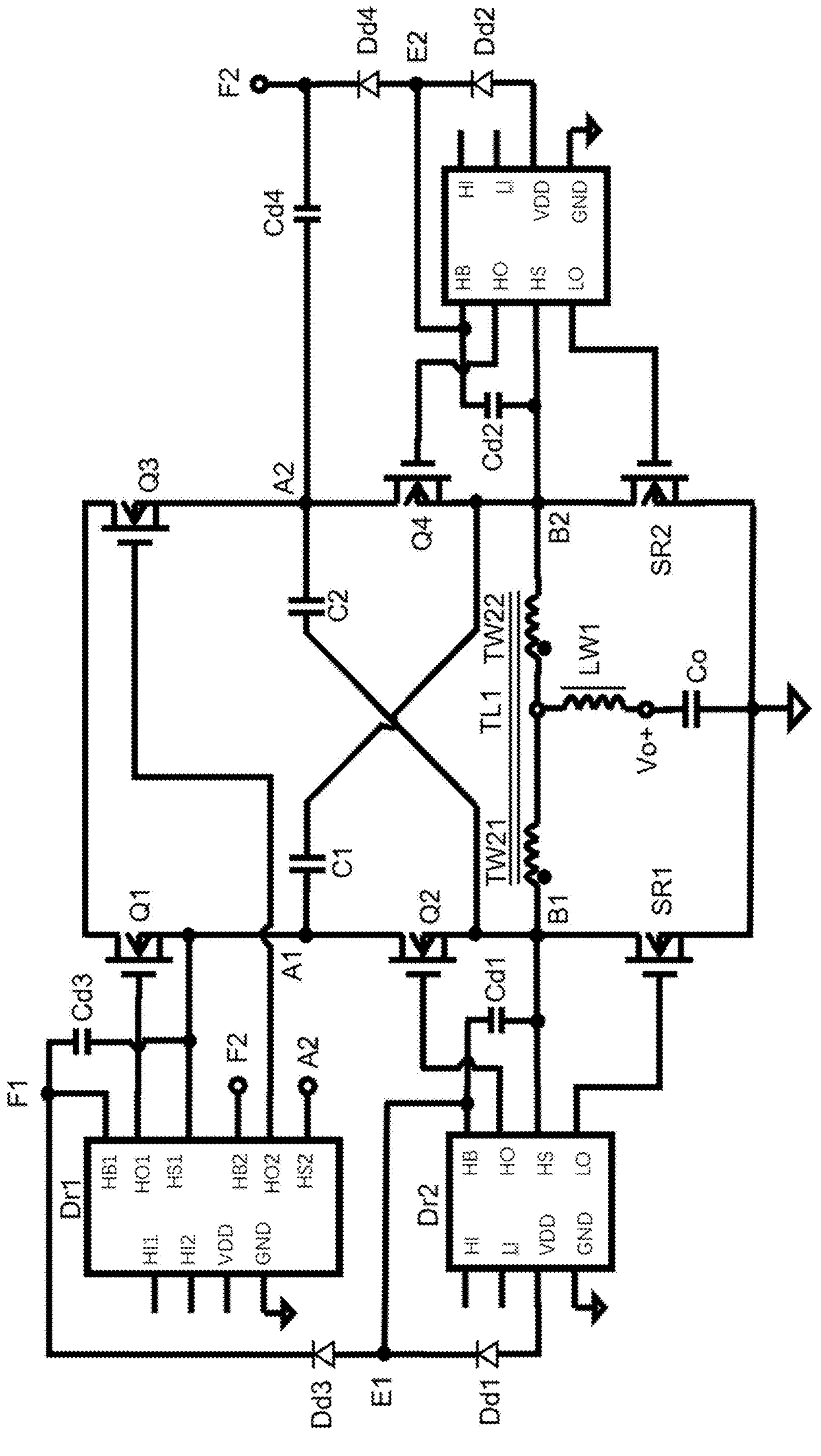
FIG. 10 is a schematic diagram of a driving power supply circuit.

In addition, the layout disclosed in FIG. 2 to FIG. 3B is equally applicable to the power conversion devices employing the circuit and control timing disclosed in FIGS. 5, FIGS. 6A-6B, FIG. 7, FIG. 8 and FIG. 9, and is also applicable to the power conversion device including the drive circuit shown in FIG. 10.

According to the transformer magnetic core or the magnetic column (the middle column) in the inductance magnetic core, the magnetic columns (side columns and the middle column) in the transformer magnetic core or the inductance magnetic core can be independently formed, the magnetic columns can be integrally formed with one magnetic substrate, or each magnetic column is divided into two parts, and each part is integrally formed with one magnetic substrate; and the transformer magnetic core material and the driving magnetic core material can be made of ferrite. The cross section of the magnetic column connected to the magnetic substrate of the transformer magnetic core or the inductive magnetic core and the cross section of the magnetic substrate may be rectangular, square, circular, oval, etc., and are not limited thereto.

The switch disclosed by the application can be a Si MOSFET, SiC MOSFET, GaN MOSFET or IGBT MOSFET and etc, and the function of the switch disclosed by the application can be realized.

The power conversion device can be part of the electronic device or an independent power supply module as long as the technical features and advantages disclosed by the application can be satisfied.

The "equal" or "same" or "equal to" disclosed by the application needs to consider the parameter distribution of engineering, and the error distribution is within +/−30%; the two line segments or the two straight lines are defined as the two line segments or the included angle between the two line segments or the two straight lines is less than or equal to 45 degrees; the included angle between the two line segments or the two straight lines is within the range of [60, 120]; and the definition of the phase error phase also needs to consider the parameter distribution of the project, and the error distribution of the phase error degree is within +/−30%.

What is claimed is:

1. A power conversion device, comprising: a circuit substrate, an upper switch, a middle switch, a lower switch, a first flying capacitor, an input capacitor, an output capacitor and a transformer, wherein the circuit substrate comprises a first surface and a second surface opposite to each other, two transformer side column holes, a transformer middle column hole, a lower switch area, a first flying capacitor area, a first upper middle switch area and an output area, wherein the lower switch area, the first flying capacitor area, the first upper middle switch area and the output area are arranged on the first surface of the circuit substrate, wherein the two transformer side column holes and the transformer middle column hole penetrate through the first surface and the second surface, and respectively used for side columns of the transformer and a middle column of the transformer to penetrate through, wherein a transformer winding area is arranged between each of the two transformer side column holes and the transformer middle column hole, a winding of the transformer penetrates through the transformer winding area, and the transformer winding area comprises a first side and a second side opposite to each other, wherein the lower switch area is arranged adjacent to the first side of the transformer winding area, the output area is arranged adjacent to the second side of the transformer winding area, the lower switch is arranged in the lower switch area, and the output capacitor is arranged in the output area, wherein the first flying capacitor is arranged in the first flying capacitor area, and the lower switch area is arranged between the first flying capacitor area and the transformer winding area, wherein the upper switch and the middle switch are arranged in the first upper middle switch area, and the first upper middle switch area is arranged adjacent to the first flying capacitor area and the lower switch area.

2. The power conversion device of claim 1, wherein the first surface further comprises an input area, the input capacitor is arranged in the input area, and the first flying capacitor area is arranged between the input area and the lower switch area.

3. The power conversion device of claim 1, wherein the first surface further comprises a second upper middle switch area, the power conversion device further comprises a second upper switch and a second middle switch, and the second upper switch and the second middle switch are arranged in the second upper middle switch area.

4. The power conversion device of claim 2, wherein the first surface further comprises a second flying capacitor area, a third flying capacitor area and a fourth flying capacitor area, wherein the power conversion device further comprises a second flying capacitor, a third flying capacitor and a fourth flying capacitor, wherein the second flying capacitor, the third flying capacitor and the fourth flying capacitor are sequentially arranged in the second flying capacitor area, the third flying capacitor area and the fourth flying capacitor area, wherein the second flying capacitor area is arranged between the lower switch area and the input area, and the third flying capacitor area and the fourth flying capacitor area are respectively arranged on outer sides of the first upper middle switch area and the second upper middle switch area.

5. The power conversion device of claim 2, wherein the second surface comprises a fifth flying capacitor area, a lower switch area, an input area and an output area, wherein the power conversion device further comprises a fifth flying capacitor, an another lower switch, an input positive terminal, an output positive terminal and an output negative terminal, wherein the input positive terminal is arranged in the input area on the second surface, the output positive terminal and the output negative terminal are arranged in the output area, the anther lower switch is arranged in the lower switch area on the second surface, and the fifth flying capacitor is arranged in the fifth flying capacitor area, wherein the lower switch area on the second surface is arranged close to one side of the transformer winding area, and the output area is arranged close to the other side of the transformer winding area, wherein and the fifth flying capacitor area is arranged between the input area on the second surface and the lower switch area on the second surface.

6. The power conversion device of claim 5, wherein a projection on the first surface of the lower switch area arranged on the second surface and a projection of the lower switch area arranged on the first surface are at least partially overlapped, wherein a projection on the first surface of the input area arranged on the second surface and a projection of the first surface are at least partially overlapped, and a projection on the first surface of the output area arranged on the second surface and the first surface arranged on the first surface are at least partially overlapped.

7. The power conversion device of claim 1, further comprising: a heat dissipation block, wherein the heat dissipation block is welded to the first surface, the heat dissipation block is adjacent to a heating component which is an upper switch, a middle switch, a lower switch, or a transformer.

8. The power conversion device of claim 7, wherein a height of the heat dissipation block is equal to a height of the heating component, and a top surface of the heat dissipation block and a top surface of the heating component are heat connected with a dissipation device.

9. The power conversion device of claim 7, wherein a bonding pad of the heat dissipation block is electrically connected with a heat dissipation bonding pad of the heating component.

10. The power conversion device of claim 1, further comprising: an input positive terminal, an input negative terminal, an output positive terminal, an output negative terminal, wherein the input capacitor is bridged between the input positive terminal and the input negative terminal, wherein the output capacitor is bridged between the output positive terminal and the output negative terminal, wherein the input negative terminal and the output negative terminal are short-connected.

11. The power conversion device of claim 10, further comprising: a grounding metal block, wherein the grounding metal block is welded to the second surface and is electrically connected to the output negative terminal.

12. The power conversion device of claim 11, wherein the grounding metal block is electrically connected to the input negative terminal and the output negative terminal.

13. The power conversion device of claim 11, wherein the grounding metal block is connected in parallel with a wiring in the circuit substrate.

14. The power conversion device of claim 10, wherein the lower switch further comprises a first lower switch and a second lower switch, wherein the upper switch, the middle switch and the first lower switch are connected in series to form a switch bridge arm, the switch bridge arm is bridged between the input positive terminal and the input negative terminal, the input positive terminal and the upper switch are electrically connected, the first lower switch and the second lower switch are electrically connected to the input negative terminal, wherein one end of the flying capacitor is electrically connected to the upper switch and the middle switch.

15. The power conversion device of claim 3, wherein the lower switch further comprises a first lower switch and a second lower switch, wherein a first upper switch, a first middle switch and the first lower switch are connected in series to form a first switch bridge arm, wherein a second upper switch, a second middle switch and the second lower switch are connected in series to form a second switch bridge arm, wherein the flying capacitor is bridged between the first switch bridge arm and the second switch bridge arm.

16. The power conversion device of claim 10, further comprising: an output inductor, wherein the output inductor is connected in series between the transformer and the output positive terminal, wherein the output inductor comprises an inductance magnetic core and an inductance winding, the inductance magnetic core comprises a plurality of inductance magnetic columns, wherein the circuit substrate further comprises a plurality of inductor holes, the plurality of inductor holes penetrate through the first surface and the second surface for the plurality of inductance magnetic columns to penetrate through, wherein an area between two adjacent inductor holes is an inductor winding area, the inductor winding area is used for the inductance winding to penetrate through, the inductor winding area comprises a first inductor side edge and a second inductor side edge.

17. The power conversion device of claim 16, wherein the first side of the transformer winding area is arranged adjacent to the first inductor side edge, and is arranged adjacent to the lower switch, wherein the second side of the transformer winding area is arranged adjacent to the second inductor side edge, and is arranged adjacent to the output area.

18. The power conversion device of claim 17, wherein the transformer winding and a short contact of the inductance winding are arranged adjacent to a first transformer side edge and the first inductor side edge.

* * * * *